(12) United States Patent
Katagiri et al.

(10) Patent No.: US 6,557,569 B2
(45) Date of Patent: May 6, 2003

(54) METHOD OF MANUFACTURING AN ELECTROPHOTOGRAPHIC PHOTOSENSITIVE MEMBER INCLUDING MULTIPLE LIQUID CLEANING STEPS AND MACHINING STEP

(75) Inventors: Hiroyuki Katagiri, Shizuoka-ken (JP); Yoshio Segi, Shizuoka-ken (JP); Hideaki Matsuoka, Shizuoka-ken (JP); Kazuhiko Takada, Shizuoka-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/871,612

(22) Filed: Jun. 4, 2001

(65) Prior Publication Data
US 2001/0049066 A1 Dec. 6, 2001

Related U.S. Application Data

(62) Division of application No. 09/467,181, filed on Dec. 20, 1999, now Pat. No. 6,318,382.

(30) Foreign Application Priority Data

Dec. 24, 1998 (JP) .......................................... 10-367216
Dec. 10, 1999 (JP) .......................................... 11-351375

(51) Int. Cl.[7] .............................. B08B 1/02; B08B 3/02; B08B 3/12
(52) U.S. Cl. ............................ 134/25.4; 134/18; 134/1; 134/10; 134/26; 134/32; 134/34; 134/902
(58) Field of Search .............................. 134/1.3, 2, 10, 134/26, 32, 40, 41, 76, 111, 186, 902, 18, 25.4, 1

(56) References Cited

U.S. PATENT DOCUMENTS 4,131,483 A   12/1978  Iwahashi et al. ............... 134/1
4,265,991 A   5/1981   Hirai et al. .................... 430/64
4,504,518 A   3/1985   Ovshinsky et al. ............ 427/38
4,701,981 A   10/1987  Leifeld .......................... 19/105
4,702,981 A   10/1987  Matsumoto et al. ........... 430/69
4,735,883 A   4/1988   Honda et al. .................. 430/69
4,967,777 A   11/1990  Takayama et al. ........... 134/102
5,361,789 A   11/1994  Yoshida et al. ............... 134/68
5,834,148 A   11/1998  Murayama et al. ............ 430/69
6,033,815 A   3/2000   Taniguchi et al. ............. 430/56
6,156,472 A   12/2000  Segi et al. .................... 430/138

FOREIGN PATENT DOCUMENTS

| JP | 54-86341   | 7/1979  |
| JP | 60-186849  | 7/1979  |
| JP | 60-262936  | 12/1985 |
| JP | 61-283116  | 12/1986 |
| JP | 62-95545   | 5/1987  |
| JP | 63-311261  | 12/1988 |
| JP | 5-61215    | 3/1993  |
| JP | 7-34123    | 2/1995  |
| JP | 10-156758  | 6/1998  |

*Primary Examiner*—Zeinab El-Arini
(74) *Attorney, Agent, or Firm*—Fitzpatrick, Cella, Harper & Scinto

(57) ABSTRACT

A method of manufacturing an electrophotographic photosensitive member includes the steps of: cleaning a substrate of the electrophotographic photosensitive member by cleaning step using a vessel and machining the substrate. The cleaning step includes a first overflowing step and a second overflowing step. In the first overflowing step, the liquid is allowed to be overflowed from a vessel while the substrate of the electrophotographic photosensitive member is immersed in the liquid contained in the vessel. In the second overflowing step, the liquid is allowed to overflow from a vessel while the substrate of the electrophotographic photosensitive member is pulled up in the liquid contained in the vessel. A flow rate $Q_2$ of the overflowing liquid of the second overflowing step is higher than a flow rate $Q_1$ of the overflowing liquid of the first overflowing step. The machining step forms a film of a photosensitive substance on the substrate.

4 Claims, 5 Drawing Sheets

METHOD OF MANUFACTURING AN ELECTROPHOTOGRAPHIC PHOTOSENSITIVE MEMBER INCLUDING MULTIPLE LIQUID CLEANING STEPS AND MACHINING STEP

This application is a divisional of application Ser. No. 09/467,181, filed Dec. 20, 1999, now U.S. Pat. No. 6,318,382.

BACKGROUND OF THE INVENTION

1. Field of the Invention

The present invention relates to a cleaning method and cleaning apparatus of a cleaning subject, and an electrophotographic photosensitive member and a method for manufacturing the same. The present invention especially relates to a cleaning method of optical parts, electronic parts, mechanical parts and precision parts, and a cleaning apparatus capable of cleaning the same, including an electrophotographic photosensitive member and a method for cleaning the electrophotographic photosensitive member comprising cleaning steps. The present invention also relates to a cleaning method by which fats and oils, fatty acids and resins adhered on the surface of a cleaning subject can be securely removed without using chlorinated solvents, and an apparatus to be used for these purposes.

2. Description of the Related Art

The method for manufacturing a substrate for use in an electrophotographic photosensitive member comprises the following steps.

The surface of a substrate for the electrophotographic photosensitive member is machined to a flatness within a prescribed degree by cutting with a diamond blade using a lathe or milling machine. The substrate subjected to surface machining is then cleaned with an aqueous solution of carbon dioxide, followed by depositing a film mainly composed of amorphous silicon to be converted into a deposition film of a photoconductive material by applying a glow discharge decomposition method on the surface of the substrate. While materials such as glass, heat-resistant synthetic resin, stainless steel and aluminum are proposed for use in the material for the substrate of the electrophotographic photosensitive member, metals are preferably used for the substrate material in most practical purposes, since metals are resistant to electrophotographic processes such as electrification, exposure, development, transfer and cleaning, thereby securing high positional accuracy in order to maintain image quality. Aluminum is one of the most suitable materials among them as a substrate for the electrophotographic photosensitive member, because aluminum is ready for machining, cheap and lightweight.

Technologies related to the substrate material of the electrophotographic photosensitive member are disclosed in U.S. Pat. No. 4,702,981 and Japanese Patent Publication Laid-open No. 60-262936. U.S. Pat. No. 4,702,981 discloses a technology for obtaining an amorphous silicon electrophotographic photosensitive member having good image quality by using an aluminum alloy containing 2000 ppm or less of iron (Fe) as a supporting member. The patent publication also discloses manufacturing steps for forming amorphous silicon by glow discharge after applying a mirror machining by cutting a cylindrical substrate with a lathe. Japanese Patent Publication Laid-open No. 60-262936 discloses an extrusion aluminum alloy being excellent in applying vacuum deposition and containing 3.0 to 6.0 wt % of magnesium (Mg), in which the contents of impurities are suppressed to 0.3 wt % or less for manganese (Mn), less than 0.01 wt % for chromium (Cr), 0.15 wt % or less for Fe and 0.12 wt % or less for silicon (Si), with a balance of Al.

Technologies for applying a surface machining to form a light receiving layer on the surface of the substrate depending on the application field of the electrophotographic photosensitive member are described in U.S. Pat. No. 4,735,883, and Japanese Patent Publication Laid-open No. 62-95545. Although U.S. Pat. No. 5,480,754 proposes a technology for cleaning the substrate with water, in which carbon dioxide is dissolved, for preventing corrosion in the cleaning step with water when an aluminum alloy is used for the substrate, no the process for recycling the water used for cleaning, consequently no flow rate of recycling water, is described.

Japanese Patent Publication Laid-open No. 5-61215 discloses the steps of circulating respective liquids in each cleaning vessel, continuously feeding a cleaning liquid into one vessel, allowing the cleaning liquid pooled in one vessel to overflow to transfer it to another vessel, and cleaning the substrate in each vessel. However, no steps for changing the circulation volume of water in the vessel in which the liquid overflows described.

While Japanese Patent Publication Laid-open Nos. 63-311261, 1-156758 and 7-34123 disclose a technology for forming an oxide film on the Al substrate, the step for circulating the cleaning water for repeatedly cleaning the substrate is not described.

Meanwhile, a variety of materials such as selenium, cadmium sulfide, zinc oxide and amorphous silicon, as well as organic substances such as phthalocyanine, are proposed in the technology of elemental materials to be used in the electrophotographic photosensitive member. A non-crystalline deposition film represented by an amorphous silicon film containing silicon atoms as principal components, or an amorphous deposition film of amorphous silicon supplemented with, for example, hydrogen and/or halogen (for example fluorine and chlorine) has been proposed as a high-performance, highly durable and non-polluting electrophotographic photosensitive member, some of which being practically used. U.S. Pat. No. 4,265,991 also discloses a technology for the electrophotographic photosensitive member whose photoconductive layer is mainly composed of amorphous silicon.

Many methods such as a sputtering method, and methods for decomposing material gases by heat (heat CVD method), light (light CVD method) and plasma (plasma CVD method) have been known in the art for depositing non-crystalline films containing silicon atoms as principal components as described above.

The plasma CVD method, by which the material gas is decomposed by plasma generated by a high-frequency or microwave glow discharge to deposit thin films on the substrate, is most suitable for depositing an amorphous silicon film for the electrophotographic photosensitive member. Practical applications of these methods have been aggressively developed in recent years. Among the CVD methods, the plasma CVD method advantage of decomposition by microwave glow discharge, or the microwave plasma CVD method, has been recently noticed as an industrial method for depositing a film.

The microwave plasma CVD method is advantageous over other methods in its high deposition rate and high conversion efficiency of material gases. One example of this microwave plasma CVD based on the advantages as described above is described in U.S. Pat. No. 4,504,518. The patent described above discloses that a good quality deposition film is obtained with a high deposition rate by the microwave plasma CVD method in a low pressure of 0.1 Torr (13.3 Pa).

A technology for improving the material gas conversion efficiency by the microwave plasma CVD method is disclosed in Japanese Patent Publication Laid-open No. 60-186849. In the technology disclosed in the patent publication described above, an inner chamber (or a discharge space) is formed by disposing the substrate so as to surround an introduction device of microwave energy to obtain a high conversion efficiency of the material gas.

Japanese Patent Publication Laid-open No. 61-283116 discloses an improved microwave technology for producing a semiconductor element. According to the technology disclosed in the patent publication above, an electrode (a bias electrode) for controlling plasma potential is provided in the discharge space. Characteristics of the deposition film are improved by depositing the film while controlling ion impact to the deposition film by applying a desired voltage (a bias voltage) to the bias electrode.

However, there remain some problems to be solved in the electrophotographic photosensitive member formed by the method as described above. One problem is how to prevent abnormal growth in the deposition film.

While abnormal growth portions are sometimes observed in the deposition film grown on the substrate, the portions have a minute area and possess insufficient surface charge. Generation of these abnormal growth portions is especially obvious in the amorphous silicon formed by the plasma CVD method. Generation of such portions possessing insufficient surface charge has been prevented by optimizing surface machining conditions, surface cleaning conditions and deposition conditions.

The following situations have been imposed on the technology:

1) Definition of positive images has been improved in response to the requirements for high image quality of the electrophotographic apparatus; and
2) Electrification conditions have became severe as a result of making copy machines high speed. Consequently, improvement of image quality at the abnormal growth portions has been required since the portions possessing insufficient electric charges substantially have a large influence on the peripheral potential.

The effect of abnormal growth on the image quality has been a small matter since a conventional electrophotographic apparatus is mainly used for copying only printed letters in a typescript (so-called line copy). However, since image qualities of the copy machine have been improved in recent years, copying many original documents containing half-tone images such as photographs is required. Therefore, for complying with these requirements, an electrophotographic photosensitive member containing a small number of abnormal growth portions is currently required. Since the effect of the abnormal growth portions on the image quality is more clearly visualized in the printed images in currently spreading color copy machines, an electrophotographic photosensitive member containing small number of abnormal growth portions is especially required.

The abnormal growth portions are so minute that localization of them is difficult even by a conductivity measurement using an electrode. When the photosensitive member is electrified, exposed and developed by integrating the substrate having the deposition film containing the abnormal growth portions into an electrophotographic process using an electrophotographic photosensitive member, especially when a uniform half-tone image is formed, images of a small potential difference ascribed to the abnormal growth portions on the surface of the electrophotographic photosensitive member may be clearly visualized.

The effect of the abnormal growth portions on the image becomes especially evident in the electrophotographic photosensitive member manufactured by the plasma CVD method, as compared with a Se electrophotographic photosensitive member manufactured by a vacuum deposition method or an OPC electrophotographic photosensitive member manufactured by a blade coating method or dipping method. However, productivity as well as repeatability of the plasma CVD method for manufacturing the electrophotograph are high, besides having wide applicability since the film can be deposited by precisely adjusting its thickness. Accordingly, highly efficient production of high quality substrates is possible when the plasma CVD method is further improved.

Solar cells are another example of the device that can be manufactured by the plasma CVD method other than the electrophotographic photosensitive member. However, overall performance, or the overall photoelectric conversion efficiency, of the solar cell is practically not affected even when the abnormal growth portions are finely distributed at specific locations on the substrate, causing subtle differences of the potential among the abnormal growth portions and other portions. Moreover, such practical problems as the quantity of generated electricity may be solved and desired specification can be attained by post-treatment in the solar cell, even when a small number of abnormal growth portions may exist. In the electrophotographic photosensitive member, on the contrary, the presence of a small number of abnormal growth portions as described above may affect the image quality. Therefore, generation of the abnormal growth portions should be especially prevented in the deposition step.

The second problem is to provide an effective cleaning method using an aqueous solvent. It has been desirable in recent years to avoid use of chlorinated solvents from the view point of preservation of the environment, and the chlorinated solvents have been replaced by aqueous solvents. However, oils and dusts floating on the surface of the cleaning liquid are liable to adhere again and contaminate the cleaning subject after cleaning, when the cleaning subject is pulled up from the cleaning vessel after cleaning with the aqueous cleaning solvent. Accordingly, an effective cleaning method using the aqueous solvent is desired, in order to efficiently wash the cleaning subject by enhancing the ability for cleaning optical parts, electronic parts, mechanical parts and precision parts and preventing the oils and dusts that have been once removed from adhering on the cleaning subject again.

The third problem is to prevent corrosion of the substrates by washing with aqueous solvents. Especially when an aluminum substrate for the electrophotographic photosensitive member as an example of the cleaning subject is washed with water, galvanic batteries are formed among impurities and peripheral aluminum, where no impurities exist, at the portions containing many impurities such as Si partially protruding from the surface of the aluminum, accelerating corrosion of the surface of the substrate. While generation of corrosion has been prevented by using an aqueous carbon dioxide solution as a cleaning solvent, a device for allowing carbon dioxide to dissolve in the cleaning solvent makes the cleaning apparatus to be complicated and therefore cleaning cost is increased. Accordingly, the construction of the apparatus should be more simplified and the cleaning cost should be reduced.

The fourth problem is to suppress irregular cleaning along the longitudinal direction from appearing when a long member along the longitudinal direction such as the substrate of the electrophotographic photosensitive member is pulled up from the cleaning solvent.

SUMMARY OF THE INVENTION

Accordingly, the object of the present invention is to provide a method for effectively washing a cleaning subject. In more detail, the object of the present invention is to provide a high performance electrophotographic photosensitive member containing a small number of irregular growth portions and a method for manufacturing the same, wherein irregular cleaning of the substrate is suppressed while preventing corrosion of aluminum.

The foregoing objects can be attained by the following means. The present invention proposes a cleaning method for enhancing cleaning ability by effectively cleaning the cleaning subject, a cleaning apparatus, and an electrophotographic photosensitive member and a method for manufacturing the same.

In a first aspect, the present invention provides a method for cleaning a cleaning subject by allowing a liquid filled in a vessel to overflow, wherein the cleaning subject is cleaned by pulling up the cleaning subject from the liquid filled in the vessel while allowing the liquid to overflow, or wherein the cleaning subject is cleaned by pulling up the cleaning subject from the liquid while increasing the flow rate of the overflowing liquid.

In accordance with another aspect of the present invention, there is provided a cleaning apparatus of a cleaning subject comprising a first vessel for containing a liquid, a flow rate control device for allowing the liquid to overflow from the vessel, a circulation device for feeding the overflow liquid to the vessel again, and a second vessel provided between the first vessel and the liquid circulation device.

In accordance with a further aspect of the present invention, there is provided a method for cleaning the substrate by allowing a liquid filled in a vessel to overflow, wherein the substrate is cleaned by pulling up the substrate from the liquid filled in the vessel while allowing the liquid to overflow from the vessel.

DESCRIPTION OF THE PREFERRED EMBODIMENT

Figure 1:
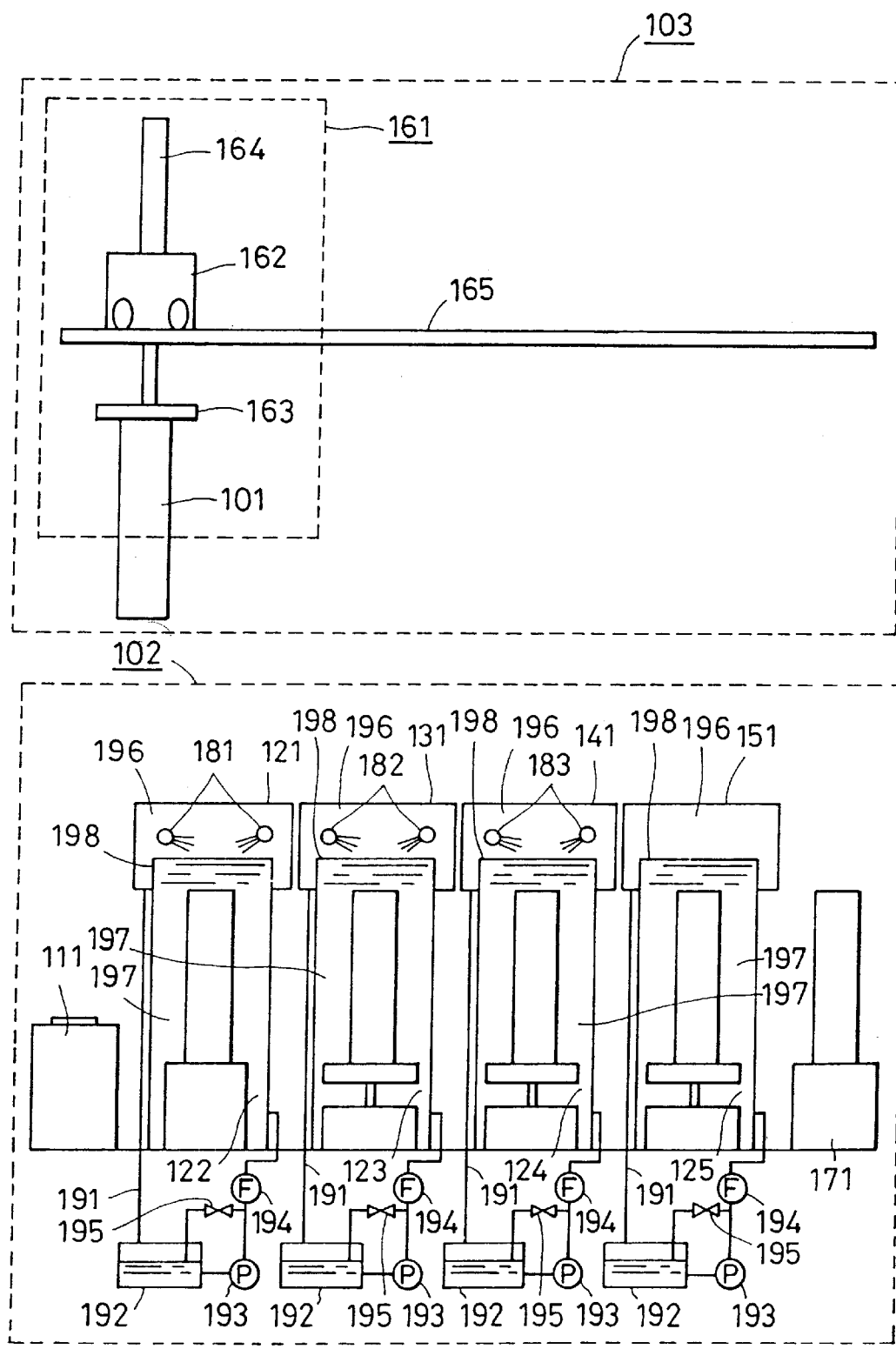
FIG. 1 is an illustrative drawing showing one example of the cleaning apparatus used for cleaning the electrophotographic photosensitive member according to the present invention.

A method for cleaning a cleaning subject, especially the method for cleaning the electrophotographic photosensitive member, will be described in the embodiment of the present invention in which an aluminum substrate is used as an example.

The cause of the appearance of abnormal growth portions on the aluminum substrate is mainly divided as:

(A) solutes in the cleaning water used in the cleaning step of dusts on the substrate and in the drying step are adhered to serve as nuclei; and (B) surface defects on the substrate serve as nuclei.

It was made possible to prevent adhesion of dusts and solutes as described in (A) to some degree by attempting to make the cutting and washing workshop of the substrate clean and strictly cleaning inside of the furnace, along with cleaning the surface of the substrate immediately before depositing a film. The causes were solved by washing the substrate with halogenated solvents such as trichloroethane. However, a cleaning method using water should be considered in place of cleaning with chlorinated solvents, because use of these chlorinated solvents has been restricted in recent years for preventing pollution such as destruction of the ozone layer.

A method for cleaning aluminum containing specified components with a specified cleaning method should be considered, in order to reduce surface defects as described in (B).

Aluminum containing silicon is preferably used as a conductive substrate in the present invention. While it is usually preferable that the content of impurities in aluminum is smaller, oxides are liable to grow when quite pure aluminum is fused for processing into a shape of the substrate, generating many abnormal growth portions. Formation of oxides can be suppressed by adding Si atoms in aluminum to be processed by fusion.

It is preferable in the present invention to use an aqueous cleaning solvent, in which silicate salts are dissolved in water as corrosion preventive agents (inhibitors), for cleaning the substrate. The aqueous cleaning solvent containing an inhibitor is used for prevention of corrosion, because aluminum containing silicon (Si) atoms may be corroded with water mainly at the portions where Si atoms are locally concentrated. Although corrosion may occur at the portions where, not only Si atoms, other atoms such as Fe atoms or Cu atoms are locally concentrated, corrosion of the aluminum substrate containing these atoms during cleaning can be efficiently prevented by using an inhibitor such as a silicate salt. Since corrosion becomes evident when the temperature of the cleaning water is high or when the cleaning water contains magnesium together with Si, Fe and Cu in order to improve cutting susceptibility, the substrate is preferably washed with an aqueous cleaning solvent containing the corrosion preventive agent.

An Al—Si—O coating film is formed by the inhibitor on the surface of the aluminum, which is thought to prevent corrosion of the aluminum substrate. Once the Al—Si—O coating film has been formed, no defects remain on the surface of the substrate, thereby allowing abnormal growth of films accompanied by deposition of a film as a functional film to be prevented.

In other words, generation of abnormal growth can be prevented by washing aluminum with an aqueous cleaning solution containing a silicate salt as an inhibitor, consequently improving characteristics of the electrophotograph formed.

The steps for cleaning the surface of the substrate preferably comprise three steps of degreasing, rinsing and drying in the present invention. The circulation volume of the cleaning solvent when the substrate is pulled up from the vessel, or when the substrate travels upward in the solvent filled in the vessel, is increased relative to the circulation volume, or the solvent overflows the vessel, when the substrate is dipped in the solvent in at least one step described above. Consequently, contaminants, such as oil components floating on the liquid surface or in the liquid by being degreased from the surface of the substrate when the substrate is dipped in the solvent, are prevented from adhering again on the surface of the substrate when the substrate is pulled up from the vessel. The effect for preventing contaminants from adhering again can be further enhanced by showering, if required, the cleaning solvent on the surface of the substrate that has been pulled up from the liquid in at least one step of the three steps.

An amorphous silicon film is preferably deposited on the substrate by the plasma CVD method in the present invention. The plasma CVD method can be divided into three processes of decomposing the material gas in the gas phase, transferring active species from the discharge space to the surface of the substrate, and allowing the active gas species to react on the surface of the substrate. The surface reaction process among the three processes plays an important role in determining the structure of the completed deposition film. Although deposition of a film in the surface reaction process is largely affected by the temperature, material and the shape of the surface of the substrate, and adsorbed substances on the surface of the substrate, the effect of the absorbed substances is the largest among them.

A high purity aluminum substrate may absorb water on its surface. When an amorphous silicon film comprising silicon, or an amorphous silicon film comprising silicon containing hydrogen and fluorine, is deposited on the substrate by the plasma CVD method, for example, in the conventional art, compositions and structures at the interfaces between the substrate and deposition film may be locally varied due to water absorbed on the surface of the substrate. When the substrate on the surface of which films containing abnormal growth portions are deposited is used for the electrophotographic process as the electrophotographic photosensitive member, differences in charge injection ability or surface potential may be caused between the portions as described above and the other portions on the surface of the substrate, consequently causing irregularity of image qualities of the image obtained by the electrophotographic process. An Al—Si—O coating film is formed using a silicate salt as an inhibitor on the surface of the substrate in the present invention, prior to forming a functional film comprising amorphous silicon by the plasma CVD method. This is because an interface capable of favorably exchanging electric charges with the substrate is formed to enable good quality of the deposition film to be formed, thereby making it possible to improve electrification ability of the substrate as well as such electrophotographic characteristics as light sensitivity.

The embodiment of the present invention will be described hereinafter in more detail with reference to FIGS. 1, 2, 3, 4 and 5. The term "760 Torr" as used herein refers to 1 atm, or 101.325 kPa.

The substrate is treated by the steps comprising degreasing the surface of the substrate and the substrate itself, rinsing the surface of the substrate, and drying the surface of the substrate in this order in the present embodiment, prior to depositing a film on the substrate. The rinsing step is divided into two steps of the rinsing step 1 and rinsing step 2, wherein in the rising step 1 coating film is formed on the substrate after completing the degreasing step using a cleaning solution in which a silicate salt is dissolved, and the substrate after completing the rinsing step 1 is rinsed again in the rinsing step 2, in order to enhance the rinsing effect. Also, fats and oils, and residues such as halogenated substances, are efficiently removed by increasing the circulation volume of the cleaning solvent when the substrate is pulled up, relative to the circulation volume when the substrate is dipped in the cleaning solvent, in at least one step including the degreasing step according to the embodiment of the present invention. A coating film having a corrosion preventive effect can be also formed on the surface of the aluminum substrate, by allowing a silicate salt to dissolve in water as a solvent to be used in the present invention. Consequently, an aluminum substrate provided with a high quality amorphous deposition film can be obtained.

FIG. 1 denotes a schematic side view of the cleaning apparatus for cleaning the surface of the substrate according to the present invention. The cleaning apparatus comprises a treatment part 102 and a substrate transfer mechanism 103. The treatment part 102 comprises a substrate feed table 111, a degreasing vessel 121, a rinsing vessel-1 131, a rinsing vessel-2 141, a drying vessel 151 and a substrate transfer table 171. Each vessel has a depth enough for placing the liquid surface above the substrate when a slender substrate is stood straight up in the vessel. The vessels are disposed with a distance apart from one another. The solvent in each vessel is used for that vessel only, and is not used for the other vessels. Temperature control devices (not shown) are provided for the degreasing vessel 121, rinsing vessel-1 131, rinsing vessel-2 141 and drying vessel 151 for maintaining the temperature of each vessel constant. The liquid filled in each vessel may be used with a composition and temperature specified for that vessel only depending on the purpose of the vessel. Ultrasonic vibrators (not shown) are provided for the degreasing vessel 121 and rinsing vessel 131 in order to enhance the degreasing effect and coating film forming effect by preventing contaminants from adhering again. Nozzles 181, 182 and 183, for showering the solvent on the substrate when it is pulled up from the vessel, are attached to the degreasing vessel 121, rinsing vessel-1 131 and rinsing vessel-2 141. The transfer mechanism 103 comprises a transfer rail 165 and a transfer arm 161, a travel mechanism 162 travelling on the transfer rail 165, a chucking mechanism 163 for holding the substrate 101, and an air cylinder 164 for allowing the chucking mechanism 163 to move up and down.

Each of the degreasing vessel 121, rinsing vessel-1 131, rinsing vessel-2 141 and drying vessel 151 is composed of a vessel to serve as a liquid receiving space 197 for receiving the liquid, and a vessel to serve as a liquid collecting space 196 for collecting the overflow liquid. A circulation path for circulating the liquid to and collecting the liquid from the receiving space is also provided in each vessel. The circulation path is composed of an overflow line 191, a reservoir 192 and a circulation pump 193. The overflow liquid from each receiving space when the flow rate for feeding the liquid to the vessel is increased is pooled in the reservoir 192 via the overflow line 191 from the liquid collecting space at the top of each vessel 121, 131, 141 and 151. The overflow line 191 is also connected to the bottom of the vessel to serve as the liquid collecting space 196. The liquid pooled in the reservoir 192 is fed to each vessel 121, 131, 141 and 151 again from the bottom parts by means of the circulation pump 193. The liquid feed volume is controlled using a by-pass line 195 equipped with a valve as a flow rate control device, and particles such as debris are collected for each vessel using a filter 194 prior to feeding the liquid to the vessel again. When the circulation volume of the liquid is to be increased, the by-pass line 195 is closed or, when the circulation volume of the liquid is to be reduced, on the other hand, the by-pass line 195 is turned open. When the circulation volume is to be constant, opening of the by-pass line 195 is adjusted to a constant level. The composition of the collected liquid to be fed to the vessel again can be also adjusted by providing a composition adjustment device (not shown). The substrate 101 can be pulled up from the liquid receiving space 197 without allowing the oils and halogenated compounds to adhere again to the substrate 101 while the overflow liquid is collected in the liquid collecting space 196, because the liquid receiving space is provided so that the liquid level of the overflow liquid collected in the liquid collecting space 196 always comes lower than the opening 198 of the liquid receiving space 197. The liquid collecting space 196 is so configured as to envelop the opening 198 of the liquid receiving space 197 from the bottom as shown in FIG. 1. Impurities such as oils and halogenated compounds collected in the liquid collecting space 196 together with the overflow liquid from the liquid receiving space 197 can be collected at the gas-liquid interface in the liquid collecting space. These impurities can be readily collected and removed from the gas-liquid interface. The impurities hardly enter into the circulation path since the overflow line 191 is provided at the bottom of the liquid receiving space, enabling the overflow liquid to be effectively used again.

While the substrate to be used in this embodiment is a cylinder made of an aluminum alloy, a mirror cutting may be applied to the substrate before treating with the substrate cleaning apparatus. The method for mirror cutting comprises the steps of: setting a diamond blade (trade name: miracle bite, made by Tokyo Diamond Co.) to a precision lathe equipped with an air-damper so as to secure an angular rake of five degree against the center angle of the cylinder; fixing the substrate with a vacuum chuck to the rotation flange of the lathe; and applying mirror cutting with a peripheral speed of 1000 m/min and feed speed of 0.01 mm/R to form a substrate with an outer diameter of 108 mm while spraying kerosine from an attached nozzle and simultaneously evacuating cutting debris through an evacuation nozzle.

The substrate after cutting is transferred to the cleaning apparatus. It is not always necessary to previously apply mirror cutting as described above to the substrate to be used in the present invention.

The substrate is cleaned by the procedure as described below.

The substrate 101 placed on the substrate feed table 111 is transferred to the degreasing vessel 121 with the transfer mechanism 103 to subject the substrate to the degreasing step. Water 122 prepared by dissolving a surfactant in pure water is filled in the degreasing vessel 121, in which impurities such as dusts and oils adhered on the surface are washed off by separating them from the substrate 101 by ultrasonic washing of the substrate 101. The substrate is held with the chucking mechanism 163 and pulled up with the air cylinder 164 as an up-and-down mechanism. The circulation flow rate before pulling up the substrate 101 is adjusted to be different from the flow rate after pulling up the substrate 101. While pulling up the substrate, an aqueous cleaning solvent 122 after separating impurities such as oils that may adhere on the substrate is showered from the nozzle 181 to the substrate 101.

The substrate 101 after completing the degreasing step is transferred to the rinsing vessel-1 131 with the transfer mechanism 103. Water kept at a temperature of 25° C. prepared by dissolving a silicate salt is filled in the rinsing vessel-1 131, and a coating film is formed on the substrate in the vessel. Ultrasonic waves are also used, if necessary, in order to prevent impurities from adhering on the substrate. Water 123 is showered from the shower nozzle 182 to the substrate 101, if necessary, while pulling up the substrate 101 with the up-and-down mechanism 164.

The substrate 101 after completing the rinsing-1 step is transferred to the rinsing-2 vessel 141 for the next rinsing step by means of the transfer mechanism 103. Pure water 124 kept at a temperature of 25° C. is filled in the rinsing-2 vessel 141, where the substrate 101 is rinsed. Purity of pure water 124 is controlled in a constant level with reference to an industrial conductivity meter (trade name: α 900R/C made by Horiba Seisakusho Co.). The substrate 101 is pulled up, if necessary, with the up-and-down mechanism 164, when pure water 124 is showered from the nozzle 183 to the substrate 101.

The substrate 101 after completing the rinsing-2 step is then transferred to the drying vessel 151 by means of the transfer mechanism 103 for the drying step. The drying vessel is filled with warmed pure water 125 kept at a temperature of 60° C. The substrate 101 dipped in warmed pure water 125 is pulled up from the warm pure water and dried while being pulled up. Purity of the warmed pure water 125 is controlled to a given level with reference to the industrial conductivity meter (trade name: α 900R/C made by Horiba Seisakusho Co.).

The substrate 101 after completing the drying step is then transferred to the transfer table 171 to carry the substrate from the cleaning apparatus.

Figure 2:
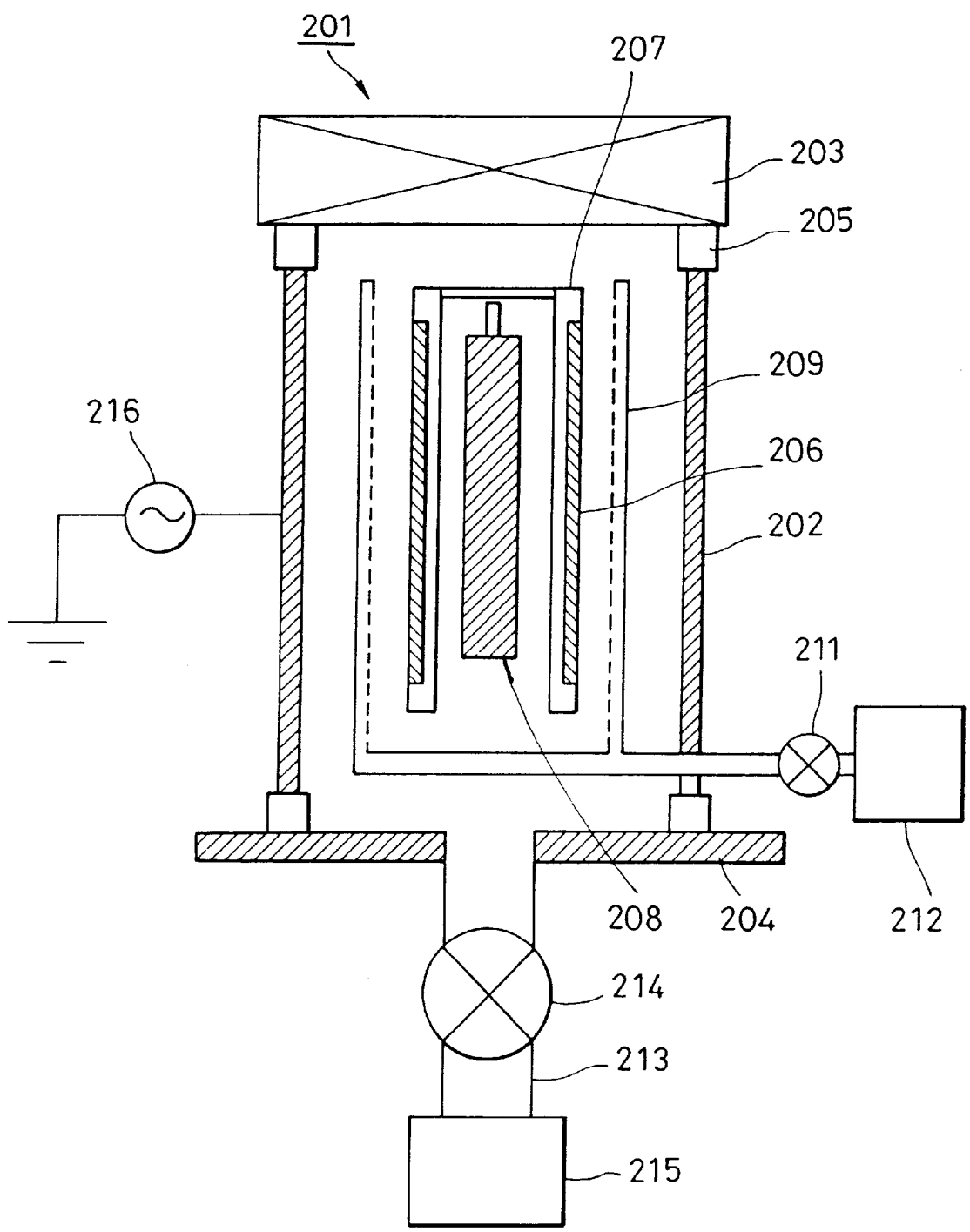
FIG. 2 is a schematic cross section of the film deposition apparatus for depositing a film on a cylindrical substrate by a RF plasma CVD method.

A film deposition apparatus for forming a film on the surface of the substrate taken out of the system as shown in FIG. 1 will be described hereinafter. FIG. 2 is a schematic drawing representing the side face of the film deposition apparatus using the plasma CVD method. A film mainly composed of amorphous silicon is deposited by using the film deposition apparatus in this embodiment.

With reference to FIG. 2, a reaction vessel 201 comprises a wall 202 that serves as a base plate 204 and cathode electrode. A substrate 206 is held by substrate holder 207 and also serving as an anode electrode, on which an amorphous silicon film is deposited, is placed at the center of the cathode electrode 202. A top plate 203 is disposed on insulator 205.

For depositing the amorphous silicon film on the substrate 206 using the film deposition apparatus, a material gas inlet valve 211 is firstly closed and an evacuation valve 214 is then turned open to evacuate the reaction vessel 201. The material gas inlet valve 211 is turned open when a vacuum gauge indicates $5 \times 10^{-6}$ Torr. The gas travels through a gas inlet tube 209 and flows into the reaction vessel 201. The material gas flows from plural openings provided in the gas inlet tube 209, which are denoted by dotted lines in FIG. 2 since it represents the side face of the openings. The gas flow rate is controlled to a given level with a mass flow controller 212. For example, a material gas such as $SiH_4$ is allowed to flow into the reaction vessel 201. After confirming that the surface temperature of the substrate 206 is adjusted to a prescribed temperature with a heater 208, glow discharge is generated in the reaction vessel 201 by applying a desired electric power to the high frequency power source 216 (at a frequency of 13.56 MHz).

The substrate 206 is rotated with a motor (not shown) at a constant speed using the longitudinal axis as a rotation axis during deposition, in order to uniformly deposit the film. The amorphous silicon film is deposited on the substrate 206 as described above. The reaction vessel 201 is evacuated by means of an exhaust pipe 213 and vacuum pump 215. Power is provided to the reaction vessel 201 by means of power source 216.

Figure 3A:
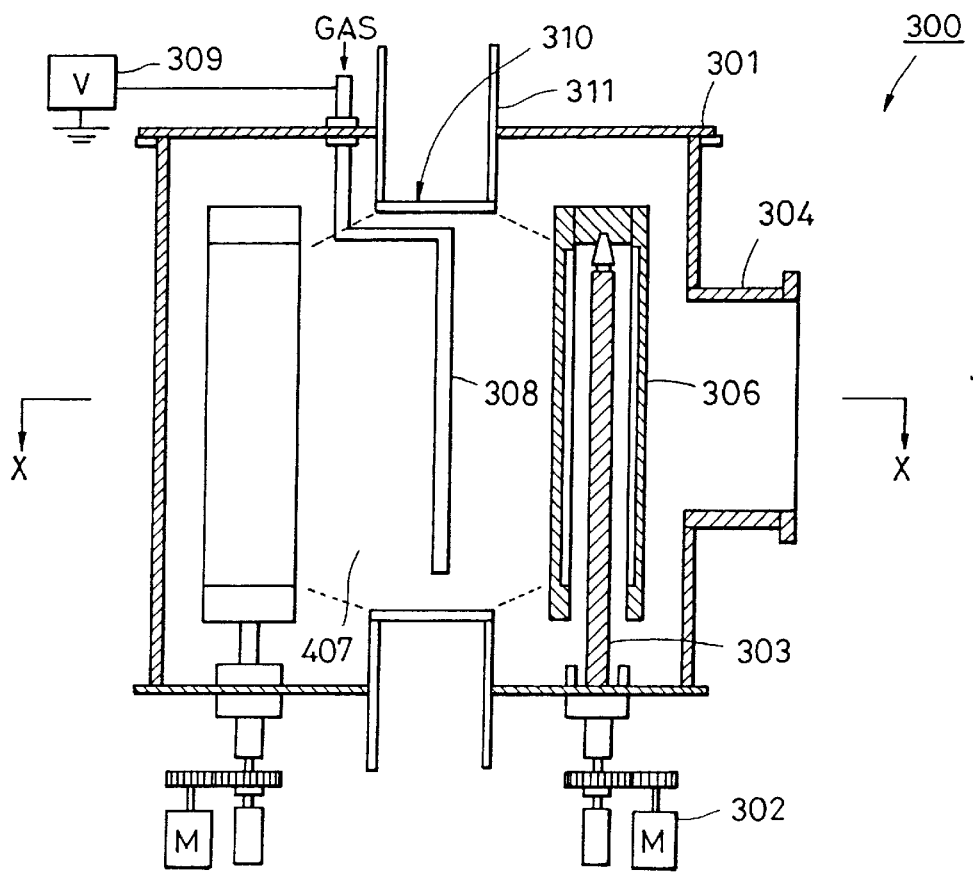
FIG. 3A is a schematic cross section of the film deposition apparatus for depositing a film on a cylindrical substrate by a microwave plasma CVD method.
Figure 3B:
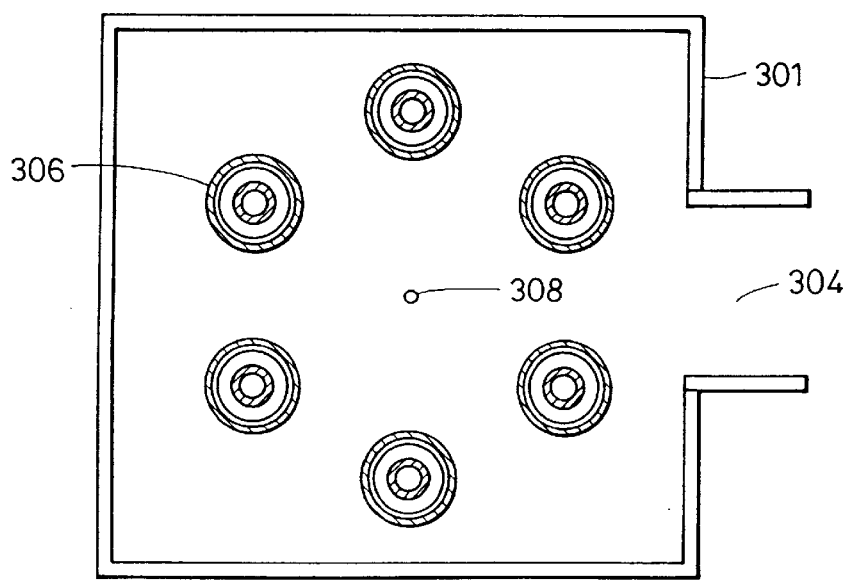
FIG. 3B is a cross section along the line X—X in FIG. 3A.

FIG. 3A and FIG. 3B denotes the microwave plasma CVD apparatus (μw plasma CVD apparatus) 300 to be used in this embodiment. FIG. 3A represents a schematic side view while FIG. 3*b* represents a schematic plane view cut along the line X—X in FIG. 3A. The microwave plasma CVD apparatus 300 is composed of a reaction vessel 301 capable of evacuation forming, in the vacuum tight structure, and an evacuation device (not shown) for evacuating the reaction vessel. A microwave guide window 310 formed with a material that efficiently transmits microwave electric power into the reaction vessel and able to maintain vacuum tightness, a microwave guide 311 connected to a microwave power source (not shown) via a stub tuner (not shown) and an isolator (not shown), a cylindrical substrate 306 on which films are deposited, a rotation mechanism 302 for rotating the cylindrical substrate 306, a substrate heater 303, and a material gas introduction tube 308 also serving as an electrode for applying an outer electric bias for controlling plasma potential are installed in the reaction vessel 301. The material gas introduction tube 308 is connected to a bias electric source 309, and the inside of the reaction vessel 301 is also connected to a diffusion pump (not shown) via the evacuation tube 304. The material gas is introduced into a space surrounded by the cylindrical substrate 306 via the material gas introduction tube 308, forming a discharge space 407.

The film is deposited as follows with this apparatus based on the microwave plasma CVD method (μw-PCVD method).

The cylindrical substrate 306 is attached in the reaction vessel 301 and is rotated by means of a rotation device 302. The inside of the reaction vessel 301 is evacuated via the evacuation tube 304 to adjust the pressure in the reaction vessel 301 to $1 \times 10^{-6}$ Torr or less. Successively, the material gas to be heated is introduced into the reaction vessel 301 via the material gas introduction tube 308 to a desired inner pressure, and the cylindrical substrate 306 is heated. After completing preparation of deposition, a charge injection reject layer, a photosensitive layer and a surface layer are formed on the cylindrical substrate 306.

Opening of the main valve (not shown) is adjusted with reference to the indication of a vacuum gauge (not shown) in order to adjust the inner pressure of the discharge space 407 to a prescribed pressure of 133 Pa. After stabilizing the pressure, a microwave with a frequency of 500 MHz or more, preferably 2.45 GHz, is generated with a microwave power source (not shown). The microwave power source (not shown) is adjusted to a prescribed output power, and the microwave (μw) energy is introduced to the discharge space 407 via the wave guide 311 and microwave guide window 310 to induce μw glow discharge. Simultaneously, an electric bias, for example a direct current bias, is applied to the gas inlet tube 308 that serves as an electrode from the power source 309. The introduced material gas is dissociated by being excited with the microwave energy in the discharge space 407 surrounded by the substrate 306. The cylindrical substrate 306 is rotated at a given rotation speed by means of a rotation mechanism 302, in order to uniformly deposit the layer.

After depositing a film with a prescribed thickness, the supply of μw power is stopped and gas flow into the reaction vessel is closed, thus completing deposition of the film.

A desired multilayer structure is formed by repeating the similar operations as described above.

The method for manufacturing an electrophotographic light receiving member formed by a high frequency plasma CVD (abbreviated as VHF-PCVD hereinafter) method using a VHF frequency band is described with reference to FIG. 4. The VHF-PCVD shown in FIG. 4 comprises a reaction vessel 421 capable of evacuation and an evacuation device (not shown) for evacuating the reaction vessel. The inside of the reaction vessel 421 is equipped with a cylindrical substrate 426 on which a film is deposited, a heater 423 for heating a supporting member, a material gas introduction tube (not shown) and an electrode 425. A high frequency matching box 428 is further provided at the electrode. The inside of the reaction vessel 421 is connected to a diffusion pump (not shown) via an evacuation tube 424. The space 427 surrounded by the cylindrical substrate 426 forms a discharge space.

The film is deposited by the VHF-PCVD method using this apparatus as follows.

The cylindrical substrate 426 is firstly attached in the reaction vessel 421 and is rotated with a driving device 422. The inside of the reaction vessel 421 is evacuated with an evacuation device (not shown) via the evacuation tube 424 to adjust the inner pressure of the reaction vessel 421 to $1 \times 10^{-7}$ Torr or less. Then, the cylindrical substrate 426 is heated at a temperature of 200 to 350° C. with the heater 423 for heating the supporting member.

After completing preparation of film deposition, each layer is formed on the cylindrical substrate 426 as follows. The material gas is introduced into the discharge space 427 via the gas introduction tube (not shown) when the temperature of the cylindrical substrate 426 has reached a prescribed temperature. Opening of the main valve (not shown) is adjusted referring the indication of a vacuum gauge (not shown) so that the pressure in the reaction vessel 421 is stabilized at a prescribed pressure of 133 Pa or less.

When the pressure is stabilized, the VHF power source (not shown) at a frequency of 105 MHz is adjusted to a prescribed power, and the VHF power is introduced into the discharge space 427 via the matching box 428 to induce glow discharge. The introduced material gas is dissociated by being excited with the discharge energy in the discharge space 427 surrounded by the cylindrical substrate 426, and a film with a prescribed thickness is deposited on the cylindrical supporting member 426, which is rotated at a desired rotation speed by means of a motor of the driving device 422 for rotating the supporting member in order to uniformly deposit the film.

After depositing a film with a desired thickness, supply of the VHF power is stopped and the gas feed valve for the inlet gas to the reaction vessel is closed, thereby completing deposition of the film.

The desired light receiving multilayer is formed by repeating similar operations as described above.

It is needless to say that the present invention is not restricted by the embodiment as hitherto described. For example, the pull-up timing refers to a time when a part of the substrate dipped in water 122 and 123, or pure water 124, or warm water 125 is exposed to out side of the liquid surface, besides the timing when the substrate completely dipped in water 122 and 123, or pure water 124, or warm water 125 is transferred upward.

The timing when a liquid such as water 122 and 123, or pure water 124, or warm water 125 overflows refers to a time when substances such as oils ready for being collected on the liquid surface have been collected on the liquid surface. Oils collected on the liquid surface may be removed by overflow of the liquid, followed by halting and resuming overflow depending on requirements. Or, overflow may be continuous. It is needless to say that the circulation flow rate is changed when the overflow is continuous. In addition, circulation and overflow allows insoluble substances that are liable to precipitate in the liquid to be prevented from accumulating in the vessel, since the overflow line 191 is connected to the bottom of a vessel to serve as a liquid receiving space 197.

A composition adjustment device (not shown) is provided in order to eliminate impurities after collecting pure water used from the drying step through the rinsing-2 step. The composition of the collected liquid is adjusted to the substantially same component as the liquid used from the degreasing step through the rinsing-1 step, and the liquid may be used in the degreasing step.

The liquid should not necessarily flow through the circulation path in the present invention, when the liquid overflows from the liquid receiving space.

In other words, impurities are required merely to be efficiently removed to outside of the liquid receiving space. For attaining the effect above, the liquid may be overflowed by directly feeding the liquid from a liquid feed device (not shown) to the liquid receiving space.

Or, the flow rate of the overflow liquid from the liquid receiving space may be increased by increasing the feed volume of the liquid fed from a feed device (not shown) to the liquid receiving.space.

Or, the flow volume of the overflow liquid from the liquid receiving space, or an apparent circulation flow volume, may be increased by feeding the liquid from the liquid feed device to the liquid receiving space while the liquid is circulating through the circulation path.

The liquid fed to the liquid receiving space from the liquid feed device (not shown) may be a fresh liquid, to consequently feed the liquid containing no impurities to the liquid receiving space and to reduce the relative concentration of impurities collected in the liquid receiving space, thereby making it difficult for the impurities to adhere to the substrate again.

The substrate may be cleaned by pulling it up from the liquid while the liquid is overflowing, because the liquid surface sometimes lowered during travel of the substrate from in the liquid to outside of the liquid, even when the liquid is continuously fed to the vessel. When the liquid level is lowered, it does not overflow the vessel and consequently fails to remove the impurities to outside of the vessel. Accordingly, when the substrate is cleaned by pulling it up while the liquid is overflowing in the present invention, the impurities are prevented from adhering to the substrate again.

While the shower nozzle is used for either the degreasing step or the rinsing step, the shower nozzle may be used for at least one step of the present invention. It is preferable to remove the impurities in the degreasing step required to have high cleaning effect, by showering the substrate with the shower nozzle.

The shower nozzles are provided inside of each vessel so as to prevent the liquid sprayed to the substrate from scattering from the vessel to outside of the vessel. Accordingly, the vessels may be disposed close to one another, or in adjoining relation with each other, to allow the overall cleaning apparatus to be small in size. The shower nozzle may be provided outside of each vessel in the present invention, provided that the liquid can be substantially sprayed to the substrate.

The setting angle of the shower nozzles 181, 182 and 183 may be designed to be freely adjustable. For example, when the shower spray is directed downward, the liquid fed from each shower nozzle can be readily received by the vessel for each step, also preventing feed water from scattering into the other vessel.

A substrate subjected to a mirror cutting for flattening the rough surface of the substrate, or a substrate subjected to a non-mirror cutting for preventing interference fringes from appearing, or a substrate having desired concave and convex patterns may be used in the present invention.

Since corrosion is accelerated at the partially protruded portions containing a high concentration of Si, Fe and Cu atoms on the aluminum surface, a silicate salt as an inhibitor for preventing abnormal growth is preferably added in the rinsing step in the present invention to form a coating film.

The inhibitor may be also dissolved in the liquid to be used for the degreasing step, provided that a coating film forming treatment is applied prior to exposing the substrate to pure water.

While examples of the inhibitors include a phosphate salt, silicate salt and borate salt, the silicate salt is especially preferable in the present invention.

While the preferable silicate salt includes potassium silicate and sodium silicate, potassium silicate is especially preferable in the present invention.

The possible surfactants to be used in the present invention include an anionic surfactant, a cationic surfactant, a nonionic surfactant, an amphoteric surfactant, or a mixture thereof. Use of a carboxylic acid salt, sulfonic acid salt, sulfuric acid salt and phosphate ester salt of an anionic surfactant, or a fatty acid ester of a nonionic surfactant is preferable in the present invention.

Pure water, as a solvent for dissolving a surfactant or an inhibitor or as pure water itself, used in the degreasing step, rinsing step or drying step according to the present invention is desirably a semiconductor grade pure water, especially a super LSI grade ultra-pure water. Actually, the grade indicating a resistivity at a water temperature of 25° C. of 1 MΩ·cm or more as a lower limit, preferably 3 MΩ·cm or more, and 5 MΩ·cm or more as an optimum is suitable for the present invention. While any level up to a theoretical resistivity (18.25 MΩ·cm) is possible for the upper limit, a resistivity of 17 MΩ·cm or less, preferably 15 MΩ·cm and most suitably 13 MΩ·cm is appropriate in the present invention considering the production cost and productivity. A concentration of fine particles with a particle size of 0.2 μm or less of 10,000/ml or less, preferably 1,000/ml or less and most suitably 200/ml is suitable in the present invention. Concentration of microorganisms as total viral microorganisms of 100 cells/ml or less, preferably 10 cells/ml and most suitably one cell/ml or less is appropriate in the present invention. Concentration of organic substances (TOC) of 10 mg/liter or less, preferably 1 mg/liter or less and most suitably 0.2 mg/liter or less is appropriate in the present invention. Of course, the aqueous solution in which solutes are dissolved or pure water filled in the vessel after being used for cleaning are not always required to maintain such purity grade as described above.

While an activated charcoal method, a distillation method, an ion-exchange method, a filtration method, a reverse osmosis method and a UV sterilization method are known in the art for obtaining water with a quality as described above, it is desirable to improve the water quality to a required level by combining some of these methods.

When the temperature of water containing the surfactant to be used in the degreasing step is too high, liquid spots appear on the surface of the substrate, where the deposition film is liable to be peeled. When the temperature is too low, on the other hand, the degreasing effect and film forming effect become so small that a sufficient coating film cannot be obtained. Consequently, a temperature range of 10° C. or more and 60° C. or less, preferably 15° C. or more and 50° C. or less, and most suitably 20° C. or more and 40° C. or less is appropriate in the present invention.

When an ultrasonic wave is used in the degreasing step according to the present invention, the effective frequency range of the ultrasonic wave used is preferably 100 Hz or more and 10 MHz or less, more preferably 1 MHz or more and 5 MHz or less, and most suitably 10 kHz or more and 100 kHz or less. The effective output power range of the ultrasonic wave used is preferably 0.1 W/liter or more and 1 kW/liter or less, and more preferably 1 W/liter or more and 100 W/liter or less.

When the concentration of the aqueous cleaning solvent containing a surfactant to be used in the degreasing step according to the present invention is too high, solvent spots remain on the substrate after pulling up the substrate, causing peeling of the deposition film.

Accordingly, a concentration range of the surfactant contained in a unit volume of water of 0.1 wt % or more and 20 wt % or less, preferably 1 wt % or more and 10 wt % or less; and most suitably 2 wt % or more and 8 wt % or less is appropriate in the present invention.

When the pH of water containing the surfactant is too high, solvent spots remain on the substrate, causing peeling of the deposition film.

Accordingly, a pH value of water containing the surfactant of 8 or more and 12.5 or less, preferably 9 or more and 12 or less, and most suitably 10 or more and 11.5 or less is suitable in the present invention.

While the circulation flow rate (the first circulation flow rate) $Q_1$ when the substrate is dipped and the circulation flow rate (the second circulation flow rate) $Q_2$ when the substrate is pulled up are changed in the present invention, the circulation flow rate may be changed in any step. While it is most suitable to change the circulation flow rate at the degreasing step, the ratio between $Q_1$ and $Q_2$ satisfies the relation of $0.1 \leq Q_1/Q_2 \leq 0.8$, preferably $0.2 \leq Q_1/Q_2 \leq 0.7$, and more preferably $0.3 \leq Q_1/Q_2 \leq 0.6$.

When the concentration of the silicate salt contained in unit volume of water is too high in the present invention, solvent spots remain on the substrate, causing peeling of the deposition film. When the concentration is too low, on the other hand, the effect of the coating film is reduced and fails to obtain the effect of the present invention. Accordingly, a concentration of 0.5 wt % or more and 2 wt % or less, preferably 0.1 wt % or more and 1.5 wt % or less, and most suitably 0.2 wt % or more and 1 wt % or less is appropriate in the present invention.

When the pH of water containing the silicate salt is too high in the present invention, solvent spots remain on the substrate, causing peeling of the deposition film. When the pH value is too low, on the other hand, the effect of the coating film is reduced to and fails to sufficiently obtain the effect of the present invention. Accordingly, the pH value of water containing the silicate salt of 8 or more and 12.5 or less, preferably 9 or more and 12 or less, and most suitably 10 or more and 11.5 or less is appropriate in the present invention.

In the present invention, too thin of a film thickness of the coating film formed on the aluminum substrate fails to exhibit its effect, but too large of a film thickness reduces conductivity between the film and the aluminum substrate, causing an adverse effect. Accordingly, a coating film thickness of 5 Å or more and 150 Å or less, preferably 10 Å or more and 130 Å or less, and most suitably 15 Å or more and 120 Å or less is appropriate in the present invention.

When the proportion of Si and O is small in the composition ratio of the Al—Si—O coating film (a coating film of the silicate salt), the coating film is not sufficient since the proportion of Al becomes large. However, a larger proportion is also not appropriate since conductivity is decreased. An appropriate ratio of Si is 0.1 or more and 0.5 or less, preferably 0.15 or more and 0.4 or less, and most suitably 0.2 or more and 0.35 or less, when the proportion of Al is taken as unity. An appropriate ratio of oxygen (O) is 1 or more and 5 or less, preferably 1.5 or more and 4 or less, and most suitably 2 or more and 3 or less, when the proportion of Al is taken as unity.

Showering the surface of the substrate after forming the coating film is also effective in the present invention.

Using the ultrasonic wave is effective for the present invention. The effective frequency of the ultrasonic wave is preferably 100 Hz or more and 10 MHz or less, more preferably 1 kHz or more and 5 MHz or less, and most suitably 10 kHz or more and 100 kHz or less. The effective output power of the ultrasonic wave is 0.1 W/liter or more and 1 kW/liter or less, and more preferably 1 W/liter or more and 100 W/liter or less.

The rinsing effect or drying effect may be improved in the present invention by dissolving carbon dioxide in the solvent to be used in the rinsing step or drying step. Quality of the water is very important, and pure water of the semiconductor grade, especially ultra-pure water of the super LSI grade before dissolving carbon dioxide is desirable. Practically, water suitable in the present invention has a lower limit of conductivity of 10 MΩ·cm or more, preferable conductivity of 3 MΩ·cm or more, and most suitable conductivity of 5 MΩ·cm or more at 25° C. Although an upper limit of up to a theoretical conductivity (18.25 MΩ·cm) is possible, a conductivity of 17 MΩ·cm or less, preferably 15 MΩ·cm or less, and most suitably 13 MΩ·cm or less is appropriate in the present invention. A particle concentration of fine particles with a particle size of 0.2 μm or less of 10,000/1 ml or less, preferably 1,000/ml or less and most suitably 200/ml is suitable in the present invention. Concentration of microorganisms as total viral microorganisms of 100 cells/ml or less, preferably 10 cells/ml and most suitably 1 cell/ml or less is appropriate in the present invention. Concentration of organic substances (TOC) of 10 mg/liter or less, preferably 1 mg/liter or less and most suitably 0.2 mg/liter or less is appropriate in the present invention. Of course, the aqueous solution in which carbon dioxide is dissolved is not always required to maintain such purity grade as described above. Or, the quality of water to be used for rinsing or drying the substrate is not always required to satisfy such purity grade as described above.

While an activated charcoal method, a distillation method, an ion-exchange method, a filtration method, a reverse osmosis method and a UV sterilization method are known in the art for obtaining water with a quality as described above, it is desirable to improve the water quality to a required level by combining some of these methods.

While the possible concentration of carbon dioxide dissolved in the solvent is up to its saturation concentration, bubbles are liable to be generated by fluctuation of water temperature when the concentration is too high, causing solvent spots by adhering the bubble on the surface of the substrate. Further, the substrate may be damaged when the concentration of dissolved carbon dioxide is too large because the pH of the solution is lowered. However, the effect of the present invention cannot be attained when the concentration of dissolved carbon dioxide is too low.

Accordingly, the concentration of carbon dioxide should be optimized by taking the required quality of the substrate into consideration.

Preferable concentration of carbon dioxide according to the present invention is usually 60% or less, more preferably 40% or less, of the saturation concentration.

Practically, the concentration of carbon dioxide in the solvent to be used in the rinsing step according to the present invention is controlled by conductivity or pH of water. The effect of the present invention becomes evident when water has a controlled conductivity in the range of preferably 2 $\mu$S/cm or more and 40 $\mu$S/cm or less, more preferably 4 $\mu$S/cm or more and 30 $\mu$S/cm or less, and most preferably 6 $\mu$S/cm or more and 25 $\mu$S/cm or less; and when water has a controlled pH value in the range of 3.8 or more and 6 or less, and more preferably 4.0 or more and 5.0 or less. Conductivity is measured with a conductivity meter by correcting the measured value to the value at 25° C.

The appropriate water temperate in the present invention is in the range of 5° C. or more and 90° C. or less, preferably 10° C. or more and 55° C. or less, and most suitably 15° C. or more and 40° C. or less.

Carbon dioxide is dissolved in water by any method, including a method by bubbling and a method using a parting membrane. Using water in which carbon dioxide is dissolved can prevent the effect of cations such as sodium ions probable by using carbonate salts such as sodium carbonate for obtaining carbonate ions.

When the surface of the substrate is washed with water obtained by dissolving carbon dioxide, the substrate is basically dipped in a water bath filled with water in which carbon dioxide is dissolved. However, the present invention is more effected by simultaneously applying a stream, or bubbling by blowing air in water.

The suitable cleaning treatment time with water in which carbon dioxide is dissolved is 10 seconds or more and 20 minutes or less, preferably 20 seconds or more and 20 minutes or less, and most suitably 30 seconds or more and 10 minutes or less, in the present invention.

Practically, the concentration of carbon dioxide in the solvent to be used in the drying step according to the present invention is controlled by the conductivity or pH of water. The effect of the present invention becomes evident when water has a controlled conductivity in the range of preferably 5 $\mu$S/cm or more and 40 $\mu$S/cm or less, more preferably 6 $\mu$S/cm or more and 35 $\mu$S/cm or less, and most preferably 8 $\mu$S/cm or more and 30 $\mu$S/cm or less; and when water has a controlled pH value in the range of preferably 3.8 or more and 6.0 or less, and more preferably 4.0 or more and 5.0 or less. Conductivity is measured with a conductivity meter by correcting the measured value to the value at 25° C. Purity of water in which carbon dioxide is dissolved, and the method for dissolving carbon dioxide in water may be the same as used in the rinsing step.

The appropriate water temperate in the present invention is in the range of 30° C. or more and 90° C. or less, preferably 35° C. or more and 80° C. or less, and most suitably 40° C. or more and 70° C. or less.

The pull up velocity for drying by pull-up is very important. Appropriate velocity in the present invention is preferably 100 mm/min or more and 2000 mm/min or less, more preferably 200 mm/min, and most suitably 300 mm/min or more and 1000 mm/min or less.

Too long of a time interval between the cleaning treatment with carbon dioxide water or pure water and introduction into the film deposition apparatus reduces the effect of the present invention, while too short of a time interval makes the production step unstable. Therefore, the appropriate time interval in the present invention is 1 minute or more and 8 hours or less, preferably 2 minutes or more and 4 hours or less, and most suitably 3 minutes or more and 2 hours or less.

While it is preferable with respect to machinability and production cost as well as for obtaining good characteristics of the film that the substrate material is principally based on aluminum, the aluminum based material containing 10 ppm or more of iron (Fe), 10 ppm or more of silicon (Si) and 10 ppm or more of copper (Cu), with a total content of Fe, Si and Cu relative to aluminum of more than 0.01 wt % and less than 1 wt % or less, is suitable in the present invention.

Allowing the substrate to contain magnesium is effective for improving machinability of the substrate in the present invention. The magnesium content is preferably in the range of 0.1 wt % or more and 10 wt % or less, and more preferably 0.2 wt % or more and 5 wt % or less.

Other elements represented by the following element symbols such as H, Li, Na, K, Be, Ti, Cr, Mn, Fe, Co, Ni, Cu, Ag, Zn, Cd, Hg, B, Ca, In, C, Si, Ge, Sn, N, P, As, 0, S, Se, F, Cl, Br and I may be contained in aluminum in the present invention other than Fe, Si and Cu.

While the shape of the substrate is determined depending on requirements, an endless belt or a cylinder is most suitable for the present invention when the substrate is used for electrophotography such as a continuous high speed copy machine. Although dimensions of the cylindrical substrate are not especially limited, a substrate having an outer diameter of 20 mm or more and 500 mm or less, and a length of 10 mm or more and 1000 mm or less is practically preferable. While the thickness of the supporting member is appropriately determined so that a desired photoconductive member is formed, it may be as thin as possible within a range sufficiently exhibiting the function as the supporting member when the photoconductive member is required to be as thin as possible. However, the thickness is usually 10 $\mu$m or more considering production performance and easy handling as well as mechanical strength.

While the possible photosensitive substances to be used in the present invention include inorganic photosensitive substances such as amorphous silicon, selenium and cadmium sulfide, and organic photosensitive substances, the effect is evident in a non-crystalline photosensitive substance containing silicon such as amorphous silicon.

Examples of the material gases to be used in depositing a film for producing a non-crystalline photosensitive substance containing silicon include material gases for forming amorphous silicon such as silane ($SiH_4$), disilane ($Si_2H_6$), tetrafluorosilicon ($SiF_4$) and hexafluorosilicon ($Si_2F_6$), or a mixed gas thereof.

Examples of dilution gases include hydrogen ($H_2$), argon (Ar) and helium (He).

Examples of characteristics improving gases for arbitrarily controlling band gap width of the deposition film include compounds containing nitrogen such as nitrogen ($N_2$ and ammonia ($NH_3$); compounds containing oxygen such as oxygen ($O_2$), nitric oxide (NO), nitrogen dioxide ($NO_2$), nitrous oxide ($N_2O$), carbon monoxide (CO) and carbon dioxide ($CO_2$); hydrocarbons such as methane ($CH_4$), ethane ($C_2H_6$) ethylene ($C_2H_4$), acetylene ($C_2H_2$) and propane ($C_3H_8$); and fluorinated compounds such as germanium tetrafluoride ($GeF_4$) and nitrogen fluoride ($NF_3$); and a mixed gas thereof.

Simultaneously introducing a dopant gas such as diborane ($B_2H_6$), boron fluoride ($BF_3$) and phosphine ($PH_3$) for doping in the discharge space is also effective in the present invention.

Any total thickness of the deposition film deposited on the substrate is acceptable in the electrophotographic photosensitive member according to the present invention, especially good images as the electrophotographic photosensitive member can be obtained at a thickness of 5 μm or more and 100 μm or less, more preferably 10 μm or more and 70 μm or less, and most suitably 15 μm or more and 50 μm or less.

While the effect of the present invention was evident in any range of the pressure in the discharge space during deposition of the film, especially good results in stability of discharge and uniformity of deposition films were obtained with good repeatability when the pressure was 66.5×10−3 Pa or more and 13.3 Pa or less, preferably $13.3 \times 10^{-1}$ Pa or more and 6.65 Pa or less.

While the effective temperature of the substrate during deposition of the film is in the range of 100° C. or more and 500° C. or less, remarkable effects were confirmed at a temperature of 150° C. or more and 450° C. or less, preferably 200° C. or more and 400° C. or less, and most suitably 250° C. or more and 350° C. or less.

A heating element with a vacuum specification may be used for heating the substrate in the present invention. Examples of them include electric resistance heating elements such as a sheathed coil heater, a plate heater and a ceramic heater; radiation heating elements such as a halogen lamp and an infrared lamp; and heat exchange heating elements using liquids and gases as heating media. Metals such as stainless steel, nickel, aluminum and copper, ceramics and heat-resistant polymer resins may be used for the surface material of the heating device. Otherwise, a vessel exclusively used for heating may be provided besides the reaction vessel, in order to transfer the substrate into the reaction vessel in vacuum after heating the substrate. The heating devices as described above may be used alone or in combination thereof.

Either a DC current, an RF current, a microwave or a wave in the VHF band may be used for the energy for generating a plasma. However, the effect of the present invention is effected by using a microwave for the energy for generating a plasma, because abnormal growth due to surface defects evidently appears, the microwave is absorbed by the absorbed moisture, and surface changes become more evident.

Although the microwave electric power for generating a plasma by microwave may have an intensity enough for discharge, the electric power appropriate for the present invention is 100 W or more and 10 kW or less, preferably 500 W or more and 4 KW or less.

It is effective in the present invention to apply a voltage (a bias voltage), preferably at least along the direction where cations impinge on the substrate, in the discharge space while depositing a film. It is also desirable to apply a bias voltage containing a DC component of 1 V or more and 500 V or less, preferably 5 V or more and 100 V or less, while depositing a film.

When the microwave is guided into the reaction vessel through a window made of a dielectrics, a material that causes small loss of the microwave such as alumina ($Al_2O_3$), aluminum nitride (AlN), boron nitride (BN), silicon nitride (SiN), silicone oxide ($SiO_2$), beryllium oxide (BeO), Teflon and polystyrene is used for the dielectrics for the window.

In the method for depositing a film in which the discharge space is surrounded by plural substrates, the substrates are preferably disposed with a distance of 1 mm or more and 50 mm or less. While the number of the substrates is determined considering productivity so as to be able to constitute the discharge space, three or more, preferably four or more substrates are appropriately used.

Although the present invention can be applied for any method for manufacturing the electrophotographic photosensitive member, it is especially effective to dispose the substrates so as to surround the discharge space to deposit a film by introducing the microwave from at least one terminal side of the substrate.

The photoelectric photosensitive member manufactured by the method according to the present invention is widely used in an electrophotographic copy machine as well as in various application fields of electrophotography such as a laser beam printer, CRT printer, LED printer, liquid crystal printer and laser scanning printing machine.

EXAMPLES

The present invention will now be described by way of examples of the method for cleaning the substrate for the electrophotographic photosensitive member. Since the present invention is effective for any objects that are cleaned by dipping in a cleaning solution, the invention is not limited to these examples.

Example 1

The surface of a cylindrical substrate, made of aluminum containing 0.05 wt % of Si, 0.03 wt % of Fe and 0.01 wt % of Cu, with a diameter of 108 mm, a length of 385 mm and a wall thickness of 5 mm was machined by the same method as described in the foregoing method for manufacturing the electrophotographic photosensitive member according to the present invention. The composition ratio of all the elements existing on the substrate shown in the present invention was measured using a X-ray fluorescence analyzer comprising magnesium (Mg) as an anode under the conditions of 15 kV and 400 W, or an energy resolution of 0.98 ev (Ag3d5/2) in a vacuum of $1 \times 10^{-9}$ Torr or less.

Fifteen minutes after completing the cutting step, the substrate was transferred to the cleaning apparatus of the present invention shown in FIG. 1. The substrate was treated in the degreasing step with a surfactant (a nonionic surfactant), rinsing step-1 and rinsing step-2, and drying step under the conditions as shown in TABLE 1. The circulation volume of water 122 in the degreasing step was different in the pull-up process from other processes of the substrate as shown in TABLE 3. After completing the treatments in the cleaning apparatus, surface appearance and presence of stains by liquid traces on the surface were visually inspected. The results are also listed in TABLE 3. The concentration of the surfactant in water used for the degreasing step was 3 wt %. The silicate salt used as an inhibitor in the rinsing step-1 of this example was potassium silicate with a concentration of 0.3 wt % in water.

Figure 5A:
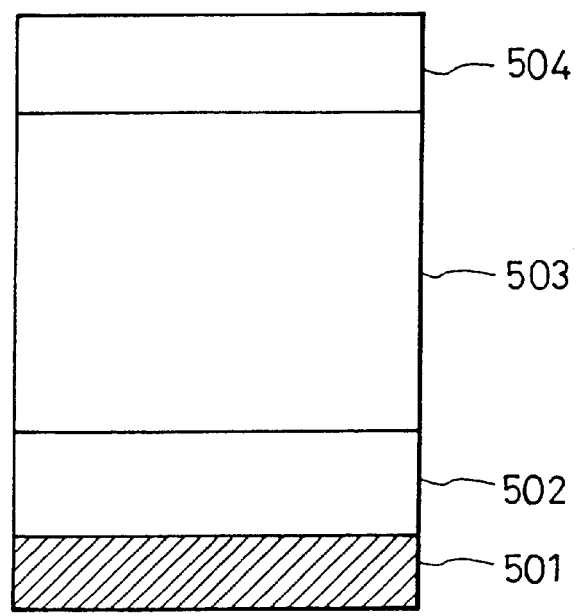
FIGS. 5A or 5B are cross sections showing a layer construction of the electrophotographic photosensitive member.

Then, an amorphous silicon film was deposited on the surface-treated substrate under the conditions shown in TABLE 2 using the film deposition apparatus to manufacture a rejection type electrophotographic photosensitive member as shown in FIG. 5A. The reference numerals 501, 502, 503 and 504 denote an aluminum substrate, a charge injection reject layer, a photoconductive layer and a surface layer, respectively, formed in this order.

Electrophotographic characteristics of the electrophotographic photosensitive member manufactured were evaluated as follows. The process speed of the electrophotographic photosensitive member manufactured was changed in a range of 200 to 800 mm/sec in the experiment. A latent image was formed on the surface of the electrophotographic photosensitive member, subjected to corona electrification from a charging device at an applied voltage of 6 to 7 kv, exposure to a laser beam with a wavelength of 788 nm. The photosensitive member was placed in a copy machine (NP 6650 made by Canon Co.), reformed so as to be able to print the image on a transfer paper by a conventional copying process, and the presence of black spots, image defects and electrophotographic characteristics, and environmental adaptability were totally evaluated based on the evaluation criteria as will be described hereinafter. The results are listed in TABLE 3.

Stains on the substrate observable with the naked eyes were confirmed by allowing a strong exposure light to reflect on the surface of the substrate after cleaning. Symbols representing the evaluation results are as follows:

◎: very good;

○: no stains, good;

Δ: pale stains, no practical problems; and

×: evident stains.

Image samples in which image defects appear most frequently among the test images, obtained by copying totally half-tone printing matters and typescripts while changing the process speed, were selected for evaluation. The evaluation method comprises observing over the image sample with a magnification glass to count the number of white dots in a unit area. The evaluation results are represented in the table using the following four marks:

◎: very good;

○: good, very fine defects are locally observed, but there are no problems;

Δ: very fine defects are observed on the overall surface, but there are no practical problems; and ×: large defects are observed on the overall surface with practical problems.

Comparative Example 1

The substrate was cleaned by the same method as described in Example 1, except that the circulation volume in the degreasing step was not charged. A rejection type electrophotographic photosensitive member was manufactured and evaluated by the same method as in Example 1. The results are listed in TABLE 3, TABLE 4 and TABLE 6 as comparative examples.

TABLE 1

| TREATING CONDITIONS | DEGREASING | RINSE-1 | RINSE-2 | DRYING |
|---|---|---|---|---|
| LIQUID IN THE VESSEL | PURE WATER CONTAINING NONIONIC DETERGENT | PURE WATER (10 MΩ · CM) | PURE WATER (10 MΩ · CM) | PURE WATER (10 MΩ · CM) |
| LIQUID TEMPERATURE | 40° C. | 25° C. | 25° C. | 45° C. |
| TREATMENT TIME | 5 MINUTES | 1.5 MINUTES | 1 MINUTE | 1 MINUTE |
| OTHER CONDITIONS | •ULTRASONIC TREATMENT •FLOW RATE $Q_1$ DURING DIPPING ARE DIFFERENT FROM FLOW RATE $Q_2$ DURING PULL-UP | — | — | — |
| INHIBITOR | — | — | — | — |

Note:
The mark (•) denotes that the cleaning solvent contains an inhibitor.

TABLE 2

| | CHARGE INJECTION REJECT LAYER | PHOTOCONDUCTIVE LAYER | SURFACE LAYER |
|---|---|---|---|
| | 400 800 1500 6.5 | 400-430-430 800-1250-1250 1.25 | 186-169-30-25 |
| | 104 | — | |
| | 3.7 | 3.7-7.3-7.3 | 4.0-5.98 |
| POWER (W) | 160 | 320-700-700 | 250 |
| TIME (MIN) | 34 | INITIAL 10 + 350 | 31 |

TABLE 3

| FLOW RATE RATIO ($Q_1/Q_2$) | APPEARANCE (SOLVENT STAIN) | RESULTS OF IMAGE EVALUATION |
|---|---|---|
| 0.05 | Δ | Δ |
| 0.1 | ○ | ○ |
| 0.2 | ○ | ○ |
| 0.3 | ◎ | ◎ |
| 0.4 | ◎ | ◎ |
| 0.5 | ◎ | ◎ |
| 0.6 | ◎ | ◎ |
| 0.7 | ○ | ○ |
| 0.8 | ○ | ○ |
| 1.0 | Δ | Δ |
| 1.1 | Δ | Δ |
| COMPARATIVE EXAMPLE 1 | Δ | Δ |

Example 3

A rejection type electrophotographic photosensitive member was manufactured and evaluated by the same method as in Example 1, except that the same substrate was used and the substrate was pulled up by showering the solution having the same composition as used in the degreasing step. The results of evaluations are shown in TABLE 4. The solution filled in the degreasing vessel was collected and used for showering after separating oils from water using a oil/water separator (not shown). The results in Comparative Example 1 are also described in TABLE 4 together with the results in EXAMPLE 1.

TABLE 4

| FLOW RATE RATIO ($Q_1/Q_2$) | APPEARANCE (SOLVENT STAIN) | RESULTS OF IMAGE EVALUATION |
|---|---|---|
| 0.05 | Δ | Δ |
| 0.1 | ○ | ○ |
| 0.2 | ◎ | ◎ |
| 0.3 | ◎ | ◎ |
| 0.4 | ◎ | ◎ |
| 0.5 | ◎ | ◎ |
| 0.6 | ◎ | ◎ |
| 0.7 | ◎ | ◎ |
| 0.8 | ○ | ○ |
| 1.0 | Δ | Δ |
| 1.1 | Δ | Δ |
| COMPARATIVE EXAMPLE 1 | Δ | Δ |

As is evident from TABLE 4, evaluations of the image including appearance and presence of stains are improved by showering the cleaning solution to the substrate during pulling-up of the substrate even when the circulation volume ratio is increased or decreased relative to that in Example 2.

Example 3

A rejection type electrophotographic photosensitive member shown in Example 1 was manufactured, after cleaning the substrate by the same method as in Example 2, except that the circulation volume of the cleaning solution was changed in the vessels other than the degreasing vessel by the same method as in Example 2 as shown in TABLE 5.

TABLE 5

| TREATING CONDITIONS | DEGREASING | RINSE-1 | RINSE-2 | DRYING |
|---|---|---|---|---|
| LIQUID IN THE VESSEL | PURE WATER CONTAINING NONIONIC DETERGENT | PURE WATER (10 MΩ · CM) | PURE WATER (10 MΩ · CM) | PURE WATER (10 MΩ · CM) |
| LIQUID TEMPERATURE | 40° C. | 25° C. | 25° C. | 45° C. |
| TREATMENT TIME | 5 MINUTES | 1.5 MINUTES | 1 MINUTE | 1 MINUTE |
| OTHER CONDITIONS | •ULTRASONIC TREATMENT •SHOWER OF SOLUTION •FLOW RATE $Q_1$ DURING DIPPING IS DIFFERENT FROM FLOW RATE $Q_2$ DURING PULL-UP | SHOWER OF SOLUTION FLOW RATE $Q_1$ DURING DIPPING IS DIFFERENT FROM FLOW RATE $Q_2$ DURING PULL-UP | SHOWER OF SOLUTION FLOW RATE $Q_1$ DURING DIPPING IS DIFFERENT FROM FLOW RATE $Q_2$ DURING PULL-UP | SHOWER OF SOLUTION FLOW RATE $Q_1$ DURING DIPPING IS DIFFERENT FROM FLOW RATE $Q_2$ DURING |
| INHIBITOR | — | — | — | — |

Note:
The mark (•) denotes that the cleaning solvent contains an inhibitor.

TABLE 6

| FLOW RATE RATIO ($Q_1/Q_2$) | APPEARANCE (SOLVENT STAIN) | RESULTS OF IMAGE EVALUATION |
|---|---|---|
| 0.05 | Δ | Δ |
| 0.1 | ○ | ○ |
| 0.2 | ◎ | ◎ |
| 0.3 | ◎ | ◎ |
| 0.4 | ◎ | ◎ |
| 0.5 | ◎ | ◎ |
| 0.6 | ◎ | ◎ |
| 0.7 | ◎ | ◎ |
| 0.8 | ○ | ◎ |
| 1.0 | Δ | Δ |
| 1.1 | Δ | Δ |
| COMPARATIVE EXAMPLE 1 | Δ | Δ |

As is evident from TABLE 6, the effect of the present invention is valid when the circulation volume was changed in the vessels other than the vessel used for the degreasing step. Excellent image evaluation results could be obtained especially when the ratio of the circulation rates are high, for example at a ratio of 0.8.

Example 4

The same substrate as used in Example 1 was cleaned by the same conditions as shown in TABLE 7, wherein the kinds of the silicate salts were changed as shown in TABLE 8. A rejection type electrophotographic photosensitive member was manufactured and evaluated by the same method as in Example 1. The results are shown in TABLE 8.

TABLE 7

| TREATING CONDITIONS | DEGREASING | RINSE-1 | RINSE-2 | DRYING |
|---|---|---|---|---|
| SOLUTION IN THE VESSEL | PURE WATER CONTAINING NONIONIC DETERGENT | PURE WATER (10 MΩ · CM) | PURE WATER (10 MΩ · CM) | PURE WATER (10 MΩ · CM) |
| LIQUID | 40° C. | 25° C. | 25° C. | 45° C. |

TABLE 7-continued

| TREATING CONDITIONS | DEGREASING | RINSE-1 | RINSE-2 | DRYING |
|---|---|---|---|---|
| SOLUTION IN TEMPERATURE | PURE WATER | PURE | PURE | PURE |
| TREATMENT TIME | 5 MINUTES | 1.5 MINUTES | 1 MINUTE | 1 MINUTE |
| OTHER CONDITIONS | •ULTRASONIC TREATMENT •SHOWER OF DETERGENTS •$Q_1/Q_2$ = 0.5 | — | — | — |
| INHIBITOR | — | — | — | — |

Note:
The mark (•) denotes that the cleaning solvent contains an inhibitor.

TABLE 8

| | | RESULT OF IMAGE EVALUATION |
|---|---|---|
| SILICATE SALT | POTASSIUM SILICATE | ◎ |
| | SODIUM SILICATE | ○ |
| | MAGNESIUM SILICATE | ○ |

As is evident from TABLE 8, good results could be obtained by using any silicate salts in the table. However, a best result could be obtained by using potassium silicate.

Example 5

The same substrate as used in EXAMPLE 1 was used and the substrate was cleaned by the conditions shown in TABLE 7 as in Example 4. The concentration of potassium silicate represented by percentage by weight (wt %) fed to each vessel was changed as shown in TABLE 9, and the presence of stains on the surface of the substrate was observed by the naked eyes. Then, a rejection type electrophotographic photosensitive member was manufactured and evaluated by the same method as in Example 1. The results are listed in TABLE 9 and thereafter together with the results in Example 6.

TABLE 9

| | POTASSIUM SILICATE (WT %) | APPEARANCE (SOLVENT STAIN) | | EVALUATION RESULTS OF IMAGE | |
|---|---|---|---|---|---|
| 1 | 0.03 | Δ | Δ | Δ | Δ |
| 2 | 0.05 | ○ | ⊚ | ○ | ⊙ |
| 3 | 0.1 | ⊚ | ⊚ | ⊚ | ⊚ |
| 4 | 0.3 | ⊚ | ⊚ | ⊚ | ⊚ |
| 5 | 0.6 | ⊚ | ⊚ | ⊚ | ⊚ |
| 7 | 1.3 | ⊚ | ⊚ | ⊚ | ⊚ |
| 8 | 1.5 | ⊚ | ⊚ | ⊚ | ⊚ |
| 9 | 2 | ○ | ⊚ | ○ | ⊚ |
| 10 | 2.1 | Δ | Δ | Δ | Δ |

The results in TABLE 9 show that good results are obtained in the concentration range of potassium silicate in water of 0.05 wt % or more and 2.0 wt % or less.

Example 6

The substrate was cleaned under the conditions as shown in Example 5, except that an ultrasonic wave was used in the rinsing step-1 in which a cleaning solution supplemented with an inhibitor was used. The concentration of potassium silicate was also changed as in Example 5, and an electrophotographic photosensitive member was manufactured and evaluated by the same method as in Example 1. The results are also shown in TABLE 9.

It was confirmed from TABLE 9 that using an ultrasonic wave in forming a coating film is effective for the present invention.

Example 7

The substrate was subjected to the degreasing, rinsing and drying steps by the same method as in Example 4, except that aluminum substrates in which the Si contents were changed as shown in TABLE 10 were used and the silicate salt was potassium silicate. An electrophotographic photosensitive member was manufactured and evaluated by the same method as in Example 1. The results are shown in TABLE 10.

TABLE 10

| | | Si CONTENT (wt %) | RESULT OF IMAGE EVALUATION |
|---|---|---|---|
| EXAMPLE 8 | 1 | 0.001 | ○ |
| | 2 | 0.002 | ⊚ |
| | 3 | 0.04 | ⊚ |
| | 4 | 0.08 | ⊚ |
| | 5 | 0.53 | ⊚ |
| | 6 | 0.72 | ⊚ |
| | 7 | 0.99 | ⊚ |
| | 8 | 1.0 | ○ |
| | 9 | 1.13 | Δ |

As is evident from TABLE 10, a substrate evaluated to provide a good image can be obtained even when the content of Si in the substrate is changed within the range of 0.001 wt % ≦ Si ≦ 1 wt %.

Example 8

A rejection type photoelectric photosensitive member was manufactured and evaluated by the same method as in Example 7, except that the content of Fe was changed as shown in TABLE 11. The results are shown in TABLE 11.

TABLE 11

| | | Fe CONTENT (wt %) | RESULT OF IMAGE EVALUATION |
|---|---|---|---|
| EXAMPLE 9 | 1 | 0.001 | ○ |
| | 2 | 0.003 | ⊚ |
| | 3 | 0.04 | ⊚ |
| | 4 | 0.08 | ⊚ |
| | 5 | 0.48 | ⊚ |
| | 6 | 0.61 | ⊚ |
| | 7 | 0.99 | ⊚ |
| | 8 | 1.0 | ○ |
| | 9 | 1.13 | Δ |

As is evident from TABLE 11, a substrate evaluated to provide a good image can be obtained even when the content of Fe in the substrate is changed within the range of 0.001 wt % ≦ Fe ≦ 1 wt %.

Example 9

A rejection type photoelectric photosensitive member was manufactured and evaluated by the same method as in Example 7, except that the content of Cu was changed as shown in TABLE 12. The results are shown in TABLE 12.

TABLE 12

| | | Cu CONTENT (wt %) | RESULT OF IMAGE EVALUATION |
|---|---|---|---|
| EXAMPLE 8 | 1 | 0.001 | ○ |
| | 2 | 0.003 | ⊚ |
| | 3 | 0.03 | ⊚ |
| | 4 | 0.09 | ⊚ |
| | 5 | 0.46 | ⊚ |
| | 6 | 0.58 | ⊚ |
| | 7 | 0.99 | ⊚ |
| | 8 | 1.0 | ○ |
| | 9 | 1.11 | Δ |

As is evident from TABLE 12, a substrate evaluated to provide a good image can be obtained even when the content of Cu in the substrate is changed within the range of 0.001 wt % ≦ Cu ≦ 1 wt %.

Example 10

An aluminum substrate in which the contents of Si, Fe and Cu were changed as shown in TABLE 13 were used and cleaned by the same method as in Example 7. A rejection type electrophotographic photosensitive member was manufactured and evaluated by the same method as in Example 1. The results are shown in TABLE 13.

TABLE 13

| | | Si CONTENT (wt %) | | | RESULT OF IMAGE EVALUATION |
|---|---|---|---|---|---|
| | | Si | Fe | Cu | |
| EXAMPLE 11 | 1 | 0.003 | 0.003 | 0.004 | ○ |
| | 2 | 0.004 | 0.005 | 0.002 | ◉ |
| | 3 | 0.001 | 0.02 | 0.005 | ◉ |
| | 4 | 0.01 | 0.03 | 0.005 | ◉ |
| | 5 | 0.03 | 0.001 | 0.04 | ◉ |
| | 6 | 0.02 | 0.05 | 0.1 | ◉ |
| | 7 | 0.25 | 0.20 | 0.01 | ◉ |
| | 8 | 0.3 | 0.3 | 0.4 | ○ |
| | 9 | 0.4 | 0.4 | 0.4 | Δ |

As is evident from TABLE 13, a substrate evaluated to provide a good image can be obtained even when the contents of Si, Fe and Cu in the substrate are changed within the range of 0.001 wt % ≦ Si+Fe+Cu ≦ 1 wt %.

Example 11

The surface of a cylindrical substrate composed of aluminum, containing 0.03 wt % of Si, 0.03 wt % of Fe and 0.04 wt % of Cu, with a diameter of 108 mm, a length of 358 mm and a wall thickness of 5 mm was machined by the same procedure as in Example 1 of the method for manufacturing the electrophotographic photosensitive member according to the present invention. Fifteen minutes after completing the machining step, the surface of the substrate was cleaned under the conditions as shown in TABLE 14. Then, a rejection type electrophotographic photoconductive member having a layer structure as shown in FIG. 5A was deposited on the substrate under the conditions shown in TABLE 15 using a film deposition apparatus with which a film is deposited by generating a microwave as show in FIG. 3. The concentration of potassium silicate in water was 0.3 wt %. Electrophotographic characteristics of the electrophotographic photosensitive member manufactured as described above were evaluated with respect to image defects, black spots, and photographic characteristics 1 and 2. Each evaluation result was obtained by using 10 pieces each of the photosensitive members manufactured by the same deposition condition.

TABLE 14

| TREATING CONDITIONS | DEGREASING | RINSE-1 | RINSE-2 | DRYING |
|---|---|---|---|---|
| SOLUTION IN THE VESSEL | PURE WATER CONTAINING NONIONIC DETERGENT | PURE WATER (10 MΩ · CM) | PURE WATER (10 MΩ · CM) | AQUEOUS CARBON DIOXIDE SOLUTION (20 μS CM) |
| LIQUID TEMPERATURE | 40° C. | 25° C. | 25° C. | 45° C. |
| TREATMENT TIME | 5 MINUTES | 1.5 MINUTES | 1 MINUTE | 1 MINUTE |
| OTHER CONDITIONS | •ULTRASONIC TREATMENT •SHOWER •$Q_1/Q_2 = 0.4$ | — | — | — |
| INHIBITOR | — | — | — | — |

Note:
The mark (•) denotes that the cleaning solvent contains an inhibitor.

TABLE 15

| | CHARGE INJECTION REJECT LAYER | PHOTOCODUCTIVE LAYER | SURFACE LAYER |
|---|---|---|---|
| KIND OF GAS AND FLOW RATE | | | |
| $SiH_4$ (sccm) | 400 | 400→450→450 | 186→169→ |
| $H_2$ | 800 | 800→1300→13000 | 30→25 |
| $B_2H_6$ (sccm) (RELATIVE TO $SiH_4$) | 1500 6.5 | 1.25 | |
| NO (sccm) | — | | |
| $CH_4$ (sccm) | | | |
| INNER PRESSURE ($\times 10^4$ Pa) | 3.8 | 3.7→7.3→7.3 | 4.0→5.98 |
| POWER (W) | 200 | 320→700→700 | 250 |
| TIME (MIN) | 34 | INITIAL 10 + 350 | 31 |

The appearance of the electrophotographic photosensitive member manufactured was evaluated by a visual observation of film peeling. Then, the process speed was changed in a range of 200 to 800 mm/sec in the experiment. A latent image was formed on the surface of the electrophotographic photosensitive member, subjected to corona electrification from a charging device at an applied voltage of 6 to 7 kV, by exposure to a laser beam with a wavelength of 788 nm. The photosensitive member was placed in a copy machine (NP 6650 made by Canon Co.), reformed so as to be able to print the image on a transfer paper by a conventional copying process, and image quality was evaluated. The results are listed in TABLE 16 together with the results of Comparative example 1. Images were evaluated by the following method.

Image samples in which image defects appear most frequently among the test images, obtained by copying totally half-tone printing matters and typescripts while changing the process speed, were selected for evaluation. The evaluation method comprises observing over the image sample with a magnification glass to count the number of white dots in a unit area. The evaluation results are represented in the table using the following four marks:

◉: very good;
○: good, very fine white dots are locally observed;
Δ: fine defects are observed on the overall surface, but there are no practical problems in recognition of letters; and x: there are so many defects that a part of letters are hardly recognized.

An image was printed by changing the process speed so that average concentration of the image obtained by placing a totally half-tone printed matter on a copy table becomes 0.4±0.1. An image sample having most evident stains was selected among the images obtained as described above and its image quality was evaluated. The presence of black spots was visually evaluated of observing the image at a distance by 40 cm apart from the image. The image was evaluated based on the following criteria and the results are described in the table by the following four marks.:

⊚: very good, no black spots are observed on any of the copy;

○: good, although quite a few black spots are observed, they are very weak and cause no problems;

Δ: Although black spots are observed on every copy, they are so slight that there are no practical problems; and x: large black spots are observed on all copies.

The surface potential of the photosensitive member obtained at the development position when the same electrification voltage was applied at a conventional process speed is evaluated by relative electrification ability, wherein the electrification ability of the electrophotographic photosensitive member obtained in Comparative Example 1 is defined to be 100%.

Luminous energy, obtained when the potential of the photosensitive member is decreased to a prescribed level by light irradiation after applying the same electrification voltage at a conventional process speed, is evaluated as a relative sensitivity, wherein the electrification ability of the electrophotographic photosensitive member obtained in Comparative Example 1 is defined to be 100%.

TABLE 16

|  | IMAGE DEFECT | BLACK SPOT | ELECTRO-PHOTO-GRAPHIC CHARACTER-ISTICS 1 | ELECTRO-PHOTO-GRAPHIC CHARACTER-ISTICS 1 |
|---|---|---|---|---|
| EXAMPLE 1 | ⊚ | ⊚ | 132% | 122% |
| COMPARATIVE EXAMPLE 1 | ○ | ○ | 100% | 100% |

TABLE 16 shows very good evaluation results, indicating that the electrophotographic characteristics are improved.

Example 12

A rejection type electrophotographic photosensitive member manufactured by the same method as in Example 11 using the same substrate as in Example 11 was evaluated by the following method. The results are shown in TABLE 17 together with the results in Comparative example 1.

A piezo element suffering an arbitrary load is used as a blade, and the tensile force applied to the blade from the drum before and after initiation of drum rotation is detected as a frictional force. The maximum coefficient of static friction was calculated from the load and maximum static friction force, and the maximum coefficient of kinetic friction was calculated from the kinetic friction force during stationary rotation of the rotor. The coefficient was relatively evaluated by defining the value in Comparative Example 1 to be 100% (the lower ratio indicates better lubricancy).

A sheet of A3 size section paper (made by Kokuyo Co.) was placed on the copy table. The degree of exposure on the section paper was adjusted within a range from the degree when lines on the section paper are hardly recognizable to the degree when fog of white spaces in the section paper starts to be visualized by changing the diaphragm aperture of the copy machine. Ten copies with various copy densities were printed.

These images were visually observed at a distance of 40 cm apart from the image to confirm if differences among the densities could be recognized. The results were evaluated by the following criteria shown in the table by four marks:

⊚: very good, no irregular images are observed on any of the copies;

○: irregular images are observed on some copies but not observed on the other copies. The degree of irregularity is so slight that there are no problems;

Δ: while irregular images are observed on every copy, the degree of irregularity is so slight that there is no practical problem; and x: large irregular images are observed on all the copies.

Image samples obtained by placing a conventional typescript comprising letters only on white paper on the copy table were visually observed to evaluate the degree of fog of white images. The results were evaluated by the following four marks.

⊚: very good;

○: good, fog is observed on a few portions of the image;

Δ: fog is observed all over the image, but letters are recognizable without any problem; and x: letters are hardly recognizable because of fog at some portion of the image.

TABLE 17

|  | LUBRICANCY | IRREGULAR IMAGE | FOG OF WIHITE IMAGE |
|---|---|---|---|
| EXAMPLE 12 | 130% | ⊚ | ⊚ |
| COMPARATIVE EXAMPLE 1 | 100% | ○ | ○ |

TABLE 17 clearly shows that the evaluation results are very good.

Figure 5B:
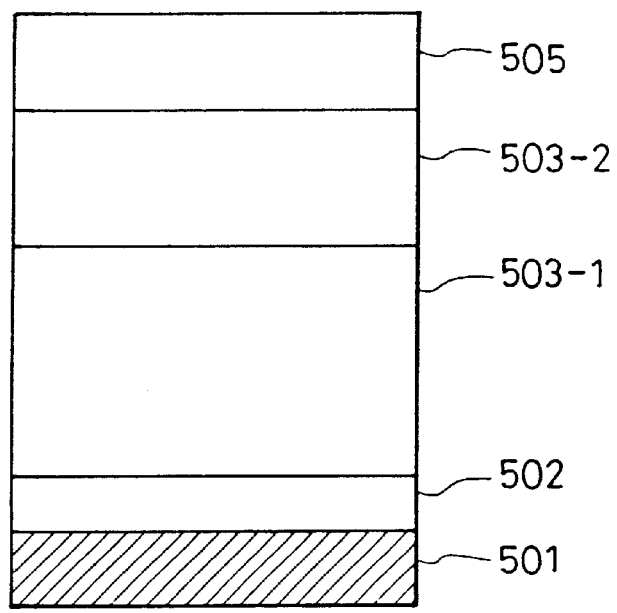

After subjecting the same substrate as used in Example 11 to a surface treatment by the method as in Example 11, a rejection type electrophotographic photosensitive member as shown in FIG. 5B was manufactured under the conditions as shown in TABLE 18 using a μw PCVD apparatus that is a film deposition apparatus for depositing a film by generating a microwave as shown in FIG. 3A and FIG. 3B. The results of evaluation by the method as in Example 11 are shown in TABLE 19. The degreasing, rinsing and drying treatments shown in Comparative Example 1 were applied to the substrate and the rejection type electrophotographic photosensitive member shown in FIG. 5B was manufactured by the conditions as shown in TABLE 18. The evaluation results are also shown in TABLE 19. The reference numerals 501, 502, 503-1 and 503-2, and 505 denote an aluminum substrate, a charge injection reject layer, a charge transfer layer, a charge generation layer and a surface layer, respectively. The characteristics of the electrophotograph manufactured according to this example were evaluated relative to the characteristics of the electrophotograph manufactured according to Comparative Example 1 defined to be 100%.

FIG. 3A shows a side view for describing the microwave CVD apparatus, wherein the reference numeral 301 denotes a chamber for housing the substrate 306, the reference numeral 302 denotes a motor for allowing the substrate 306 to rotate for depositing a film on the surface of the substrate 306, the reference numeral 303 denotes a heater for heating the substrate 306 for depositing a film, the reference numeral 304 denotes an evacuation path for evacuating the chamber 301, and the discharge space 407 is a space between the substrate 306 and the electrode 308.

A direct current electric power is supplied to the electrode 308 with a electric power supply device 309.

The electrode 308 also serves as an inlet tube for introducing a gas into the chamber 301.

The reference numeral 310 denotes a microwave guide window for introducing a microwave conducting through the guide path 311 into the chamber 301.

FIG. 3B shows a cross section along the line X—X of the microwave CVD apparatus in FIG. 3A.

TABLE 18

|  | CHARGE INJECTION REJECTION LAYER | CHARGE TRANSFER LAYER | CHARGE GENERA- TION LAYER | SURFACE LAYER |
|---|---|---|---|---|
| FLOW RATE OF MATERIAL GAS |  |  |  |  |
| SiH$_4$ | 360 sccm | 360 sccm | 360 sccm | 70 sccm |
| He | 100 sccm | 100 sccm | 100 sccm | 100 sccm |
| CH$_4$ | 40 sccm | 40 sccm | 40 sccm | 350 sccm |
| PRESSURE | 1000 ppm | 0 ppm | 0 ppm | 0 ppm |
| MICROWAVE | 1.4 Pa | 1.4 Pa | 1.33 Pa | 1.6 Pa |
| BIAS VOLTAGE | 1000 W | 1000 W | 1000 W | 1000 W |
| FILM | 100 V | 100 V | 100 V | 100 V |
| THICKNESS | 3 μm | 200 μm | 5 μm | 0.5 μm |

TABLE 19

|  | IMAGE DEFECT | BLACK SPOT | ELECTRO- PHOTO- GRAPHIC CHARACTER- ISTICS 1 | ELECTRO- PHOTO- GRAPHIC CHARACTER- ISTICS 1 |
|---|---|---|---|---|
| EXAMPLE 12 | ⊚ | ⊚ | 135% | 128% |
| COMPARATIVE EXAMPLE 1 | ○ | ○ | 100% | 100% |

The present invention is valid for different apparatus and layer constructions as is evident from TABLE 19.

Example 14

Figure 4:
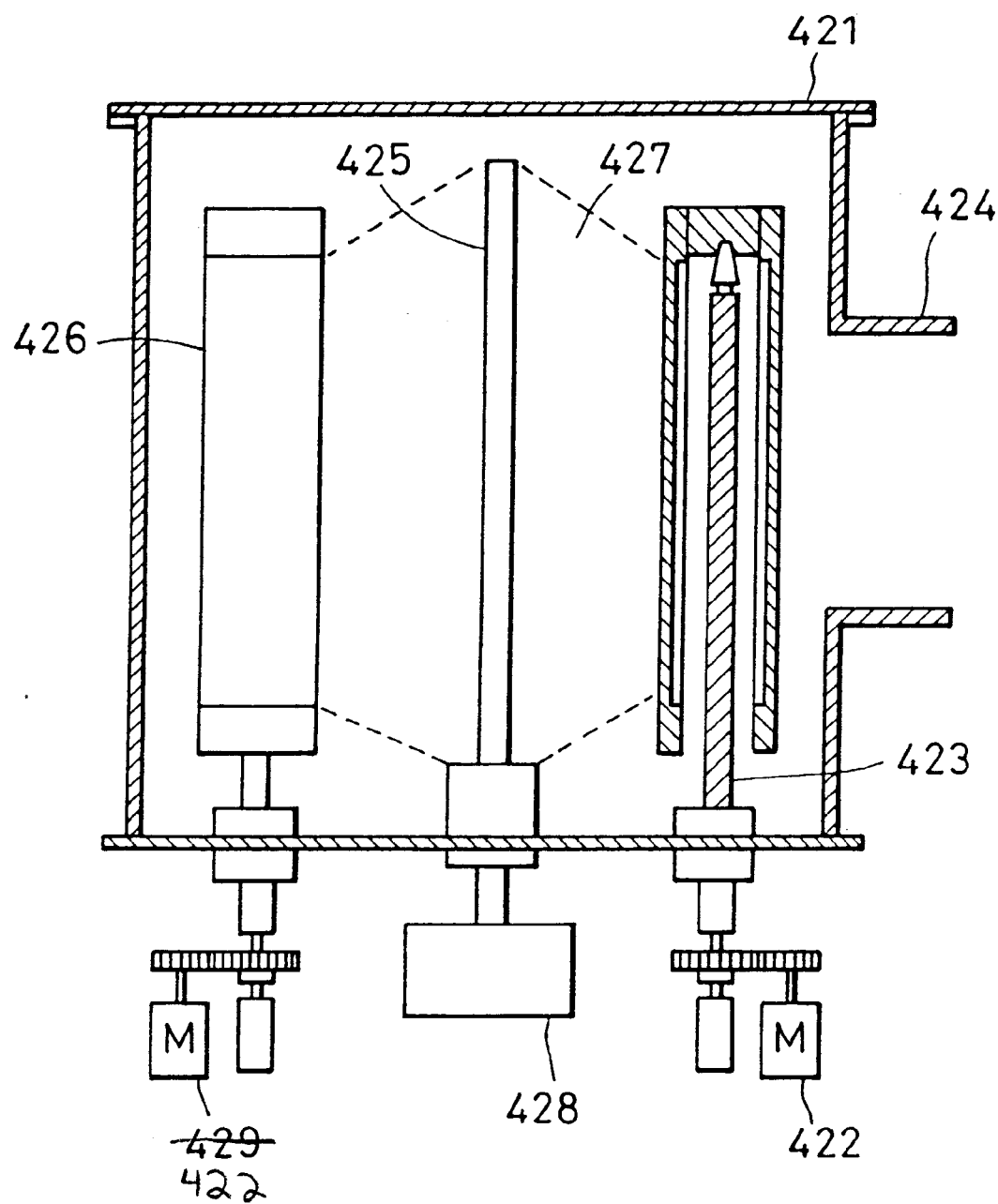
FIG. 4 is a schematic cross section of the film deposition apparatus for depositing a film on a cylindrical substrate by a VHF plasma CVD method.

After subjecting the same substrate as used in Example 11 to the same surface treatment as in Example 11, a rejection type electrophotographic photosensitive member having the layer structure as shown in FIG. 5B was manufactured by the conditions shown in TABLE 20 using a VHF PCVD apparatus 421 that is a film deposition apparatus for depositing a film using a VHF band wave shown in FIG. 4. The photosensitive member was evaluated and good results as in Example 11 were obtained.

In FIG. 4, the reference numeral 422 denotes a motor for allowing the substrate 426 to rotate for depositing a film on the surface of the substrate 426, the reference numeral 423 denotes a heater for heating the substrate 426 for depositing the film, the reference numeral 424 denotes an evacuation path for evacuating the evacuation space 427 that is a space between the substrate 426 and an electrode 425, and the reference numeral 428 denotes a high frequency wave matching box.

A material gas introduction tube (not shown) and an electrode 425 are provided in the apparatus, and the high frequency wave matching box 428 is connected to the electrode 425. The discharge space 427 is connected to a diffusion pump (not shown) through the evacuation tube 424.

A VHF electric power is applied to the discharge space 427 through the high frequency matching box 428 by setting, for example, a VHF power source (not shown) with a frequency of 500 MHz at a desired electric power after the pressure has been stabilized by evacuation to generate a glow discharge in the apparatus. The material gas introduced into the discharge space 427 surrounded by the substrates 426 is dissociated by being excited with the discharge energy, depositing a prescribed film on the substrate 426.

The apparatus shown in FIG. 4 is suitable for mass production since it is able to simultaneously manufacture plural photosensitive members as the apparatus shown in FIG. 3 can.

TABLE 20

|  | CHARGE INJECTION REJECT LAYER | PHOTOCODUCTIVE LAYER | SURFACE LAYER |
|---|---|---|---|
| KIND OF GAS AND FLOW RATE |  |  |  |
| SiH$_4$ (sccm) | 200 | 200→240 | 200→10→10 |
| H$_2$ | 660 | 600→960 |  |
| B$_2$H$_6$ (sccm) (RELATIVE TO SIH$_4$) | 1500 | 3 |  |
| NO (sccm) | 10 |  |  |
| CH$_4$ (sccm) |  |  |  |
| SiF$_4$ |  |  |  |
| INNER PRESSURE (×10$^3$ Pa) | 4.0 | 4.0 | 2.0 |
| POWER (W) | 200 | 200→600 | 250 |
| TIME (MIN) | 2.5 | 28 | 0.5 |

As described above, impurities removed from the substrate by cleaning can be prevented from adhering on the cleaning subject again to improve the cleaning effect, by making the circulation flow rate of the cleaning liquid during pull-up of the substrate larger than the circulation flow rate when the cleaning subject is dipped in the liquid in the cleaning method of the surface of the cleaning subject. The effect for preventing impurities from adhering again becomes evident especially when the surface of the substrate is cleaned in advance to deposition of a film in the method for manufacturing an electrophotographic photosensitive member in which a functional film is deposited on an aluminum substrate by a plasma CVD method. Using a liquid containing an inhibitor to form an Al—Si—O coating film on the surface of the substrate allows a high quality film to be deposited on the surface of the substrate, thereby enabling a uniform and high quality of electrophotographic photosensitive member to be constantly produced with a cheap production cost.

What is claimed is:

1. A method of manufacturing an electrophotographic photosensitive member, said method comprising the steps of:

(i) cleaning a substrate of the electrophotographic photosensitive member by a cleaning method using a liquid, which is contained in a vessel, wherein said cleaning step includes:
- a first overflowing step, wherein the liquid is allowed to be overflowed from the vessel while the substrate of the electrophotographic photosensitive member is immersed in the liquid contained in the vessel; and
- a second overflowing step, wherein the liquid is allowed to overflow from the vessel while the substrate of the electrophotographic photosensitive member is pulled up in the liquid contained in the vessel, wherein a flow rate $Q_2$ of the overflowing liquid of said second overflowing step is higher than a flow rate $Q_1$ of the overflowing liquid of said first overflowing step, and (ii) machining the cleaned substrate of the electrophotographic photosensitive member, wherein said machining step forms a film of a photosensitive substance on the substrate.

2. A method according to claim 1, wherein $Q_1$ and $Q_2$ satisfy the following condition:

$$0.2 \leq Q_1/Q_2 \leq 0.7.$$

3. A method according to claim 1, wherein $Q_1$ and $Q_2$ satisfy the following condition:

$$0.3 \leq Q_1/Q_2 \leq 0.6.$$

4. A method according to claim 1, wherein the electrophotographic photosensitive member comprises an amorphous silicon film formed on the substrate.

* * * * *

UNITED STATES PATENT AND TRADEMARK OFFICE
CERTIFICATE OF CORRECTION

PATENT NO. : 6,557,569 B2
DATED : May 6, 2003
INVENTOR(S) : Hiroyuki Katagiri

It is certified that error appears in the above-identified patent and that said Letters Patent is hereby corrected as shown below:

<u>Title page,</u>
Item [56], References Cited, FOREIGN PATENT DOCUMENTS,
"60-186849 7/1979" should read -- 60-186849 9/1985 --.

<u>Column 2,</u>
Line 23, "described." should read -- are described. --.

<u>Column 6,</u>
Line 29, "is" should read -- are --.

<u>Column 9,</u>
Line 40, "kerosine" should read -- kerosene --; and
Line 53, "dusts" should read -- dust --.

<u>Column 11,</u>
Line 4, "denotes" should read -- denote --.

<u>Column 17,</u>
Line 19, "temperate" should read -- temperature --; and
Line 55, "temperate" should read -- temperature --.

<u>Column 19,</u>
Line 11, "66.5x10-3 Pa" should read -- $66.5 \times 10^{-3}$ Pa --; and
Line 53, "a dielectrics," should read -- a dielectric, i.e. --.

<u>Column 21,</u>
Line 7, "eyes" should read -- eye --; and
Line 58, "ARE" should read -- IS --.

<u>Column 23,</u>
Table 5, "DURING" (fourth occurrence) should read -- DURING-PULL-UP --; and
"PULL-UP" (first occurrence) should be deleted; and
Line 57, "are" should read -- is --.

<u>Column 24,</u>
Line 40, "SOLUTION IN PUREWATER PURE PURE PURE" should be deleted.

<u>Column 25,</u>
Line 5, "eyes." should read -- eye. --.

UNITED STATES PATENT AND TRADEMARK OFFICE
CERTIFICATE OF CORRECTION

PATENT NO. : 6,557,569 B2
DATED : May 6, 2003
INVENTOR(S) : Hiroyuki Katagiri

It is certified that error appears in the above-identified patent and that said Letters Patent is hereby corrected as shown below:

Column 29,
Line 9, "of" should read -- by --.

Column 31,
Line 43, "SPOT" should read -- STAIN --.

Signed and Sealed this

Second Day of December, 2003

JAMES E. ROGAN
*Director of the United States Patent and Trademark Office*